United States Patent
Warschauer et al.

(10) Patent No.: US 8,781,219 B2
(45) Date of Patent: Jul. 15, 2014

(54) HIGH ACCURACY BEAM PLACEMENT FOR LOCAL AREA NAVIGATION

(75) Inventors: Reinier Louis Warschauer, Portland, OR (US); Richard J. Young, Beaverton, OR (US); Chad Rue, Portland, OR (US); Peter D. Carleson, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 159 days.

(21) Appl. No.: 13/481,054

(22) Filed: May 25, 2012

(65) Prior Publication Data

US 2012/0328151 A1 Dec. 27, 2012

Related U.S. Application Data

(63) Continuation-in-part of application No. 13/285,229, filed on Oct. 31, 2011, now Pat. No. 8,358,832, which is a continuation of application No. 12/577,200, filed on Oct. 11, 2009, now Pat. No. 8,059,918.

(60) Provisional application No. 61/494,828, filed on Jun. 8, 2011, provisional application No. 61/104,732, filed on Oct. 12, 2008.

(51) Int. Cl.

| | |
|---|---|
| *G06K 9/00* | (2006.01) |
| *H04N 5/228* | (2006.01) |
| *H01J 37/304* | (2006.01) |
| *H01J 37/22* | (2006.01) |
| *G06T 7/00* | (2006.01) |
| *H01L 21/66* | (2006.01) |
| *H01J 37/28* | (2006.01) |

(52) U.S. Cl.
CPC ..... *G06T 7/0042* (2013.01); *G06T 2207/30148* (2013.01); *G06T 2207/10061* (2013.01); *H01J 37/3045* (2013.01); *H01J 37/222* (2013.01); *H01L 22/12* (2013.01); *H01J 37/28* (2013.01); *H01J 2237/31749* (2013.01)
USPC ........................ 382/162; 348/222.1

(58) Field of Classification Search
USPC ........................ 382/162, 164, 128; 348/222.1
See application file for complete search history.

(56) References Cited

U.S. PATENT DOCUMENTS

| | | | |
|---|---|---|---|
| 3,326,176 | A | 6/1967 | Sibley |
| 4,393,311 | A | 7/1983 | Feldman et al. |

(Continued)

FOREIGN PATENT DOCUMENTS

| | | |
|---|---|---|
| JP | 06-120310 | 4/1994 |
| JP | 10303199 | 11/1998 |

(Continued)

OTHER PUBLICATIONS

FEI Company Product Data, "Helios NanoLab 600i," www.fei.com/products/dualbeams/helios-nanolab.aspx, © 2012.

(Continued)

*Primary Examiner* — Yon Couso
(74) *Attorney, Agent, or Firm* — Scheinberg & Associates, PC; Michael O. Scheinberg; John B. Kelly

(57) ABSTRACT

An improved method of high accuracy beam placement for local area navigation in the field of semiconductor chip manufacturing. Preferred embodiments of the present invention can also be used to rapidly navigate to one single bit cell in a memory array or similar structure, for example to characterize or correct a defect in that individual bit cell. High-resolution scanning is used to scan only a "strip" of cells on the one edge of the array (along either the X axis and the Y axis) to locate a row containing the desired cell followed by a similar high-speed scan along the located row (in the remaining direction) until the desired cell location is reached. This allows pattern-recognition tools to be used to automatically "count" the cells necessary to navigate to the desired cell, without the large expenditure of time required to image the entire array.

2 Claims, 15 Drawing Sheets

(56) References Cited

U.S. PATENT DOCUMENTS

| | | |
|---|---|---|
| 4,451,738 A | 5/1984 | Smith |
| 4,683,378 A | 7/1987 | Shimase et al. |
| 5,054,097 A | 10/1991 | Flinois et al. |
| 5,086,230 A | 2/1992 | Adachi et al. |
| 5,159,643 A | 10/1992 | Kaga et al. |
| 5,278,408 A | 1/1994 | Kakibayashi et al. |
| 5,401,972 A | 3/1995 | Talbot et al. |
| 5,435,850 A | 7/1995 | Rasmussen |
| 5,541,411 A | 7/1996 | Lindquist et al. |
| 5,851,413 A | 12/1998 | Casella et al. |
| 6,724,005 B2 | 4/2004 | Tokumoto |
| 7,002,513 B2 | 2/2006 | Brabec et al. |
| 7,221,314 B2 | 5/2007 | Brabec et al. |
| 7,351,966 B1 | 4/2008 | Marchman et al. |
| 7,442,916 B2 | 10/2008 | Lee et al. |
| 7,442,928 B2 | 10/2008 | Ohnishi |
| 7,518,110 B2 | 4/2009 | Sutani et al. |
| 7,676,077 B2 * | 3/2010 | Kulkarni et al. ............... 382/144 |
| 7,695,683 B2 * | 4/2010 | Quan et al. .................... 422/504 |
| 8,111,903 B2 * | 2/2012 | Herschbein et al. .......... 382/149 |
| 2002/0035717 A1 | 3/2002 | Matsuoka |
| 2003/0001109 A1 | 1/2003 | Morio et al. |
| 2003/0231791 A1 * | 12/2003 | Torre-Bueno et al. ........ 382/133 |
| 2007/0069158 A1 | 3/2007 | Ohnishi |
| 2010/0092070 A1 | 4/2010 | Young et al. |
| 2010/0128944 A1 * | 5/2010 | Zahniser et al. .............. 382/128 |

FOREIGN PATENT DOCUMENTS

| | | |
|---|---|---|
| JP | 2007080695 | 3/2007 |
| JP | 2007201300 | 8/2007 |
| WO | 2010042916 | 4/2010 |

OTHER PUBLICATIONS

Extended European Search Report for Application No. 12171116.2, dated Feb. 15, 2013.

Extended European Search Report for Application No. 09820024.9, dated Feb. 15, 2013.

Japanese Office Action for Application No. 2011-531241, dated Oct. 24, 2013.

* cited by examiner

HIGH ACCURACY BEAM PLACEMENT FOR LOCAL AREA NAVIGATION

This application claims priority from U.S. Pro. App. 61/494,828, filed Jun. 8, 2011, and claims priority from and is a continuation-in-part of U.S. patent application Ser. No. 13/285,229, filed Oct. 31, 2011, which is a continuation of U.S. patent application Ser. No. 12/577,200, filed on Oct. 11, 2009, which claims priority from U.S. Prov. App. No. 61/104,732, filed on Oct. 12, 2008, all of which are hereby incorporated by reference.

TECHNICAL FIELD OF THE INVENTION

The present invention relates to stage navigation and beam placement in particle beam systems and, in particular, to high accuracy local area navigation to a site of interest on a sample surface using acquisition of a high-resolution image by FIB or SEM means.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting lines, spacing and diameter of contact holes, and the surface geometry such as corners and edges of various features.

As a result, careful monitoring of surface features is becoming increasingly important. As design rules shrink, the margin for error in processing becomes smaller. Even small deviations from design dimensions may adversely affect the performance of a finished semiconductor device.

Accordingly, semiconductor customers are requiring high accuracy beam placement to locate features such as single bit fails in memory arrays or locations for circuit edit. Beam shift navigation systems suffer from sample drift, non-linearity in displacement, and are typically limited in field of view. Typical sample stages used on particle beam systems are only accurate to ±1-2 µm. Without a high accuracy stage (like a laser-encoded stage) it is not possible to drive the stage directly to the location of interest with accuracy of 100 nm or less. Laser stages may have the capability for 100 nm accuracy but are expensive and limit the system flexibility as the stage generally cannot be tilted, thereby losing functionality. Further, it is desirable to drive sample stages within an accuracy of approximately 30 nm, which is beyond the capability even of typical laser stages.

In a typical memory array, it is often desirable to navigate to one single bit cell in the array, for example to characterize or correct a defect in that individual bit cell. A typical bit cell might be on the order of 50 nm in size, while the total array might have an area of 100 µm×100 µm. Navigation to an individual cell is currently done manually, by slowly moving the stage and counting the cells manually until the desired location is reached. Such a manual process may take up to 10 minutes to drive to a specific cell. Automatic navigation, for example using pattern recognition to automatically count the cells, would require imaging the array at a resolution sufficient to resolve features down to the cell size—in this example down to 50 nm. In order to have sufficient resolution to reliably perform pattern recognition on 50 nm cells, the array would preferably be imaged at a resolution of at least 16K, possibly up to 64K or even higher. Such a high-resolution scan (64K) of a 100 µm×100 µm array (at a dwell time of 500 ns) would take approximately 34 minutes.

Thus, there is still a need for an improved method for high accuracy navigation to the site of interest within a local area on a semiconductor surface that will allows beam placement at an accuracy beyond the positional accuracy of the sample stage. There is also a need for an improved method for high accuracy navigation that will allow rapid navigation to a single bit in an array without the necessity of manually counting. Further, there is a need for such improved methods to be suitable for complete or partial automation.

SUMMARY OF THE INVENTION

It is an object of the invention, therefore, to provide an improved method for high accuracy navigation to the site of interest within a local area on a semiconductor surface, particularly in a particle beam system such as a FIB or SEM.

This invention demonstrates a method where high accuracy navigation to the site of interest within a local area (e.g. 200 µm on a side) is possible using imaging/patterning techniques provided there are visible reference marks within the local area with a known coordinate relationship to the target site. A high-resolution image of the target area of approximately 4096 pixels wide is first acquired. Two or more alignment features are located near the target area. The area of interest is overlaid with CAD polygons onto the image. Digital zoom is utilized to precisely locate the alignment points and a two or three point CAD polygon re-registration is performed.

Once the image and the coordinate system have been properly aligned, the alignment can be transferred to the sample itself by way of one or more transfer fiducials. One or more readily identifiable features on the sample in the vicinity of the feature of interest are selected and the offset between the transfer fiducial(s) and the feature of interest is recorded. The sample can then be re-imaged at a much smaller field of view based upon the coordinate system alignment. Once the transfer fiducials are identified in the second image, the recorded offsets can be used to locate the feature of interest and accurately position the particle beam.

According to preferred embodiments of the present invention, the combination of large area, high resolution scanning, digital zoom, and registration of the image to an idealized coordinate system enables navigation around a local area without relying on stage movements. Once the image is acquired any sample or beam drift will not affect the alignment.

Preferred embodiments of the present invention can also be used to rapidly navigate to one single bit cell in a memory array or similar structure, for example to characterize or correct a defect in that individual bit cell. High-resolution scanning is used, not to scan the entire array, but instead to scan only a "strip" of cells on the one edge of the array (along either the X axis and the Y axis) to locate a row containing the desired cell followed by a similar high-speed scan along the located row (in the remaining direction) until the desired cell location is reached. This allows pattern-recognition tools to be used to automatically "count" the cells necessary to navigate to the desired cell, without the large expenditure of time required to image the entire array. Using preferred embodiments of the present invention, a single bit cell can typically be located automatically in less than 5 minutes, as compared to more than 30 minutes for some prior art methods.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Figure 1:
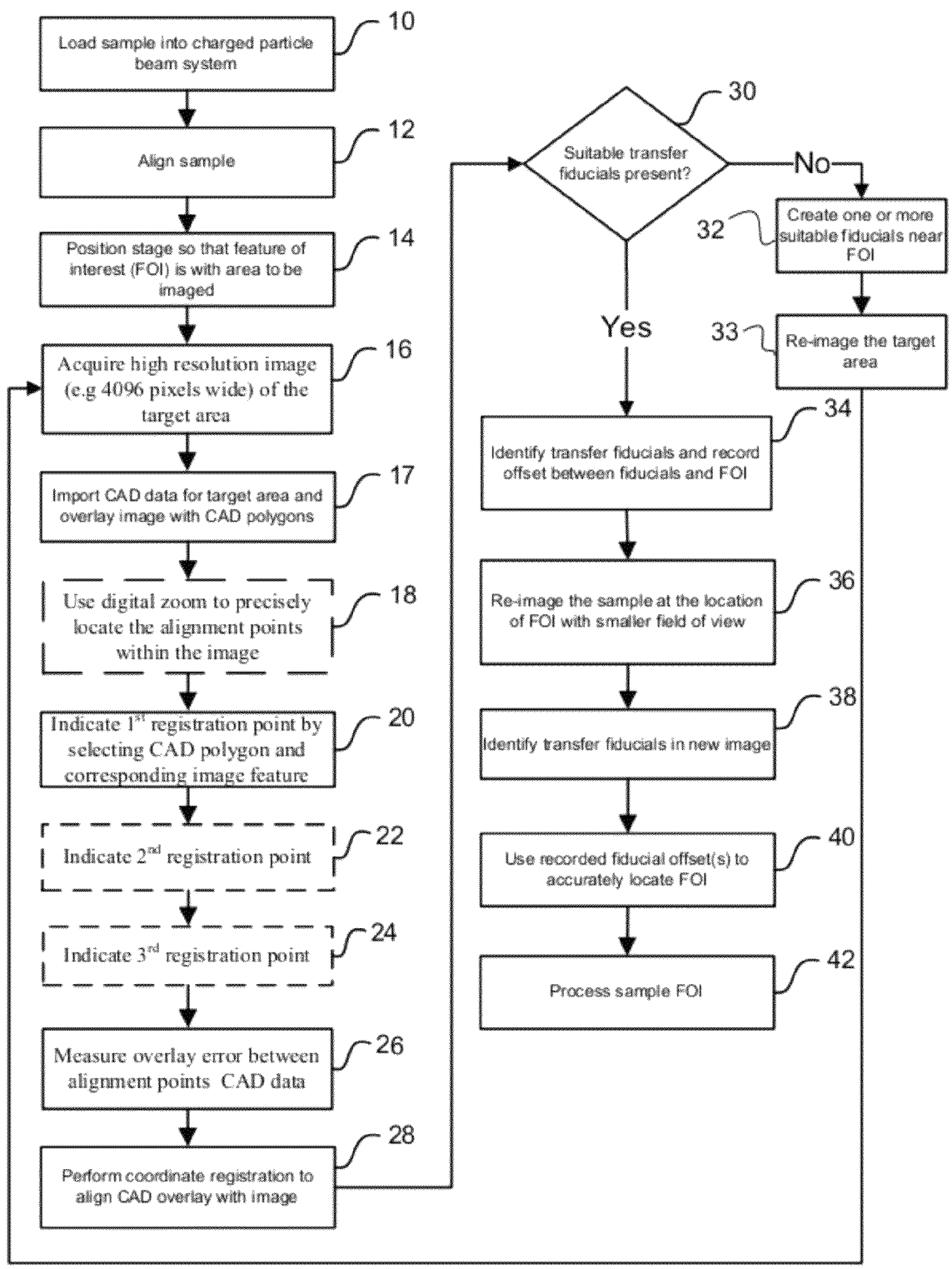
FIG. 1 is a flowchart showing the steps of high accuracy beam placement for local area navigation utilizing stageless navigation according to a preferred embodiment of the present invention.

Preferred embodiments of the present invention are directed at methods for high accuracy beam placement for local area navigation in the field of semiconductor chip manufacturing. This invention demonstrates a method where high accuracy navigation to the site of interest within a relatively large local area (e.g. an area 200 µm×200 µm) is possible even where the stage/navigation system is not normally capable of such high accuracy navigation.

According to preferred embodiments of the present invention, a high-resolution image of a relatively large target area (a larger area including the location of a feature of interest and one or more suitable alignment marks) is first acquired. For example, a suitably high-resolution area might be 250 µm wide with a resolution approximately 4096 pixels wide. According to one preferred embodiment, the area of interest is overlaid with CAD polygons and a two or three point CAD polygon re-registration is performed. Digital zoom is then utilized to precisely locate the area containing the feature of interest. An additional CAD registration process can be performed for greater accuracy. One or more suitable transfer fiducials are then located or created near the feature of interest and the offset between the fiducial and the feature of interest in the large field of view image is recorded. A smaller field of view image is then acquired that is suitable for performing the inspection/investigation. The transfer fiducial is identified in this image and the offset used to accurately locate the feature of interest.

The combination of large area, high-resolution scanning, digital zoom, and registration of the image to an idealized coordinate system enables navigation around a local area without relying on stage movements. Once the image is acquired any sample or beam drift will not affect the alignment. Preferred embodiments thus allow accurate navigation to a site on a sample with sub-100 nm accuracy—with some preferred embodiments allowing navigation within 30 nm—even without a high-accuracy stage/navigation system.

In other words, according to preferred embodiments of the present invention, the sample stage can have a positioning accuracy or error of ±500 nm or greater while the feature of interest can be located and the particle beam can be positioned relative to the sample with a positioning accuracy of ±100 nm or better (i.e., within 100 nm or less). More preferably the feature of interest can be located (i.e., the particle beam system can navigate to the location of the feature of interest on the sample) with an accuracy within ±30 nm or better. Even where the sample stage has a positioning accuracy or error of ±100 nm or greater, preferred embodiments of the present invention allow the feature of interest to be located and the particle beam to be positioned relative to the sample with a positioning accuracy of ±300 nm or better.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

FIG. 1 shows a flowchart showing the steps of high accuracy beam placement for local area navigation according to a preferred embodiment of the present invention. In step 10, the sample is loaded into a typical prior-art charged particle beam system (such as the FIB/SEM illustrated in FIG. 12 and described below) by mounting the sample on the system stage. The charged particle beam system according to a preferred embodiment of the present invention can be a focused ion beam system, an electron beam system, or a dual beam FIB/SEM system. The sample can be loaded manually or automatically, for example by an automatic handler system.

Preferred embodiments of the present invention do not require the use of a high-accuracy stage such as a laser stage. When a sample or workpiece is loaded into a charged particle beam system for analysis or processing, it can be very challenging to drive the stage to the precise location of a feature of interest. Typical sample stages have an accuracy of approximately 1-2 µm. In other words, when such a typical stage is moved to a particular coordinate, the error in position can be up to ±1-2 µm. (When expressed in this fashion, a larger number means a less accurate stage.) Advanced high-accuracy stages, such as laser interferometer stages (hereinafter "laser stages") which are capable of navigation within accuracy of 100 nm or less are very expensive. Laser stages also have some significant disadvantages in that they typically do not tilt and they are not available on the majority of charged particle beam systems currently in use. The present invention provides a method of navigation with sub-100 nm accuracy that does not require a high-accuracy laser stage. Preferably, embodiments of the present invention provide a method of sub-100 nm navigation or beam placement using a sample stage with an accuracy (positional error) of ±500 nm. More preferably, embodiments of the present invention provide a method of sub-100 nm navigation or beam placement using a sample stage with an accuracy (positional error) of ±1-2 µm or greater.

After the sample is loaded, in step 12, the sample is aligned using known methods, for example by a typical three-point lock on the corners of the die. This alignment can also be accomplished manually, for example by an operator using an optical microscope, or automatically, for example by using an automatic handler robot which locates a notch or flat edge of the sample in order to determine the proper orientation.

In step 14, the stage is positioned so that the location of the feature of interest is within the target area to be scanned by the charged particle beam (the field of view). (In some cases, the feature of interest may not actually be visible in the image, such as for example when the feature of interest is buried.) This positioning can be accomplished, for example, by storing and using positional coordinates or computer-aided design (CAD) data. The field of view should be large enough so that, considering the accuracy of the stage/system being used, it is assured that the feature of interest is within area to be imaged, preferably along with one or more appropriate alignment features suitable for use in registering the image with a coordinate system representing the locations of features on the sample surface (as discussed in greater detail below). More preferably, the field of view will include at least three features suitable for use as alignment features. Suitable features should be easily recognizable in the sample image and in the coordinate system overlay.

In step 16, sample is imaged at high resolution with the charged particle beam. The image must be of sufficient (high enough) resolution so that the pixel size is comparable to the placement precision required. The image resolution is preferably high enough that the pixel size allows the alignment marks to be identified and their locations accurately determined. More preferably the resolution is high enough that the pixel size is the same size of smaller than the size of the alignment features. For example, in a preferred embodiment of the present invention, this means that for a 250 µm wide image a resolution of 4096 (or greater) pixels could be used, resulting in pixels of about 50-60 nm in size. As a result, alignment features larger than 50-60 nm could easily be identified. Other preferred embodiments of the present invention use image resolution resulting in a pixel size of 10-100 nm, more preferably pixel sizes of 30-60 nm.

In some preferred embodiments, resolution resulting in a pixel size that is larger than the size of the feature of interest could also be used, although the larger pixel size would contribute to positional error. For example, if the pixel sizes in the embodiment described in the preceding paragraph were used (50-60 nm) with an alignment feature 30 nm in size, there would be no way to determine where the alignment feature was positioned within the pixel. As a result, the positional error (resulting solely from the pixel size) of the alignment feature could be as much as 20-30 nm (50-60 nm minus 30 nm). Since this degree of accuracy is still more than can be achieved even by typical laser stages, this degree of accuracy will be acceptable in many cases.

The location of the target (feature of interest) and preferably the location of the alignment features should also be known in some form of coordinate system. In preferred embodiments, the locations can be determined from a CAD overlay (as described in greater detail below) or x, y coordinates or else the structure is a repeating array.

The image should be of sufficient resolution that the pixel size is at least comparable to the precision required. For example, in one preferred embodiment, a 250 µm wide image would be approximately 4096 pixels wide, resulting in pixels about 60 nanometers in size. This would be suitable for imaging or processing features, such as the alignment points, that are 60 nanometers in size or larger. However, a higher resolution (and resulting smaller pixel size) would be required for features that are smaller than 60 nm.

There is a direct balance between field of view (also called horizontal field width or HFW) image resolution and pixel spacing: HFW=(pixel spacing)*(number of pixels). To navigate over an area much larger than 250 µm×250 µm ones demonstrated here would result in a likely reduction in the accuracy obtainable due to larger pixel spacing and possible scan distortions unless the resolution of the patterning engine was increased to 8 k or 16 k wide images. In some cases, mapping may be required to understand any scan distortions/non-linearities.

Figure 2:
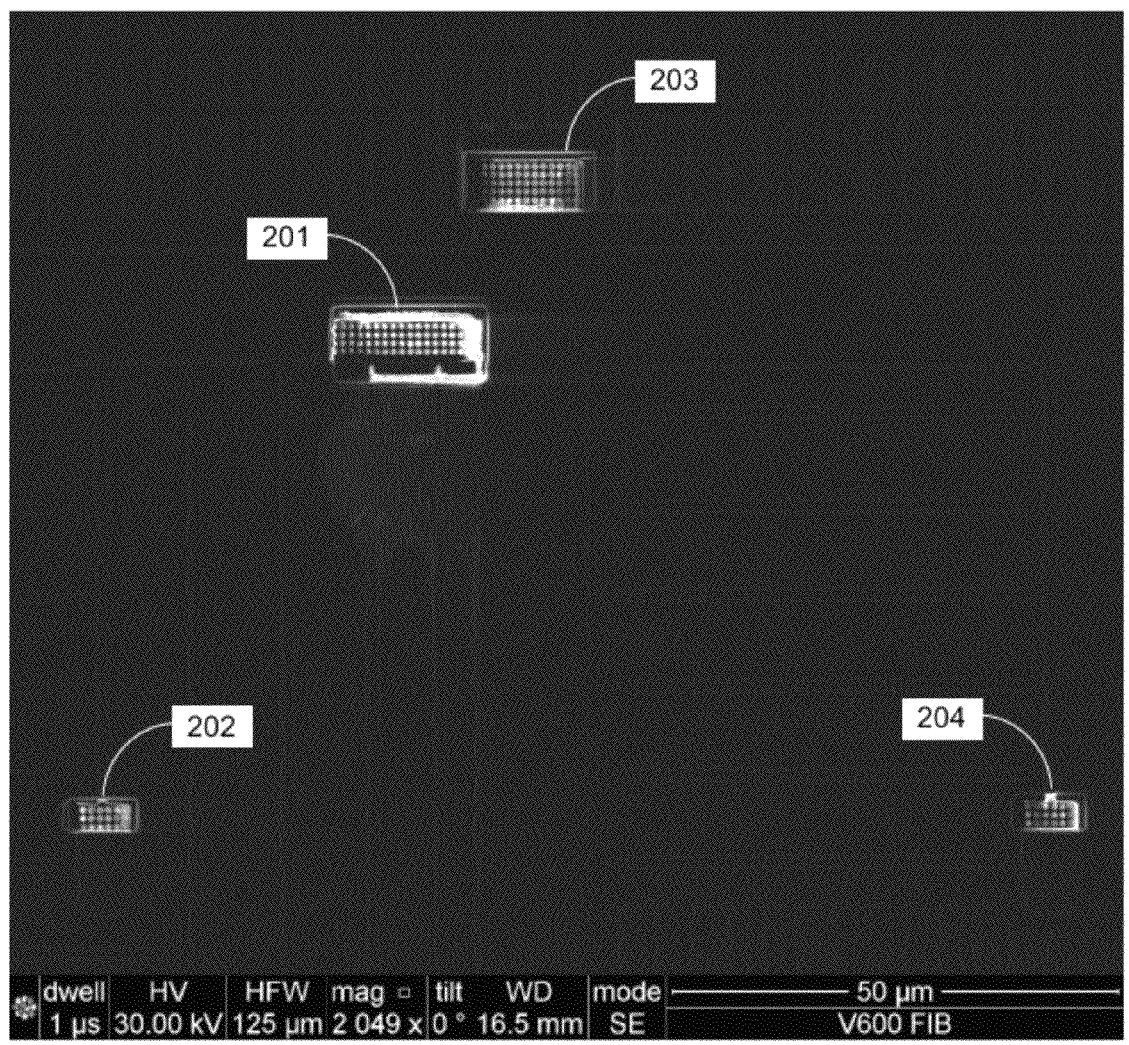
FIG. 2 shows an image of a sample including a target and alignment features to be used in the initial image/CAD overlay registration according to a preferred embodiment of the present invention.

FIG. 2 shows an image of a sample obtained as described above by driving the stage to the coordinates for a feature of interest and three alignment features to be used in the initial image/CAD overlay registration (described below). As shown in FIG. 2, the target 201 (containing the feature of interest) and the three alignment features (202, 203, 204) are all via fields, which have been partially exposed on a semiconductor surface by milling through a surface layer. The field of view should be large enough so that, considering the accuracy of the stage/system being used, it is assured that the location of the feature of interest is within the area to be imaged. For example, in a particle beam system with a sample stage having an accuracy of ±2 μm, the field of view for a feature of interest and three alignment features approximately 2000 nm apart should be at least 8 μm×8 μm to ensure that the feature of interest is within the field of view imaged. Typically, however, a much larger field of view of approximately 125 μm×125 μm could be used according to the present invention.

Figure 3:
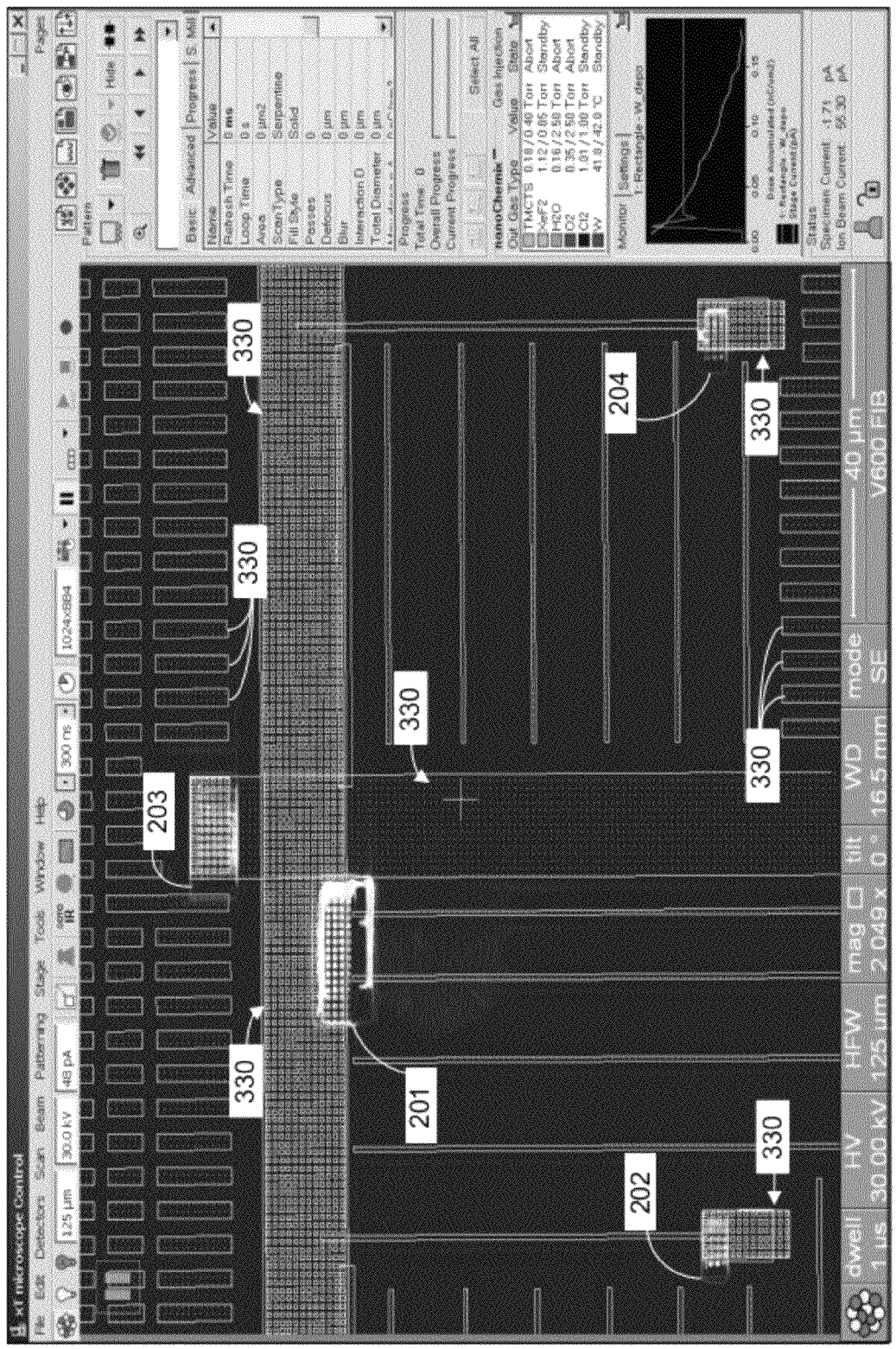
FIG. 3 shows the image of FIG. 2 with an overlay showing the CAD polygons prepared from the CAD data superimposed on the image.

Referring again to FIG. 1, in step 17 an overlay showing the CAD polygons 330 (idealized geometric shapes that represent the locations of features on the sample or workpiece) can be constructed from the computer-aided design (CAD) data for the elements/features on the semiconductor sample and superposed on the charged particle beam image of the sample. Such a coordinate system overlay is shown in FIG. 3. If necessary, an initial registration between the CAD overlay and the image can be performed as described below. Note that in FIG. 3, a number of the semiconductor features indicated by the CAD polygons have not been exposed and are still buried under the surface layer.

Figure 4:
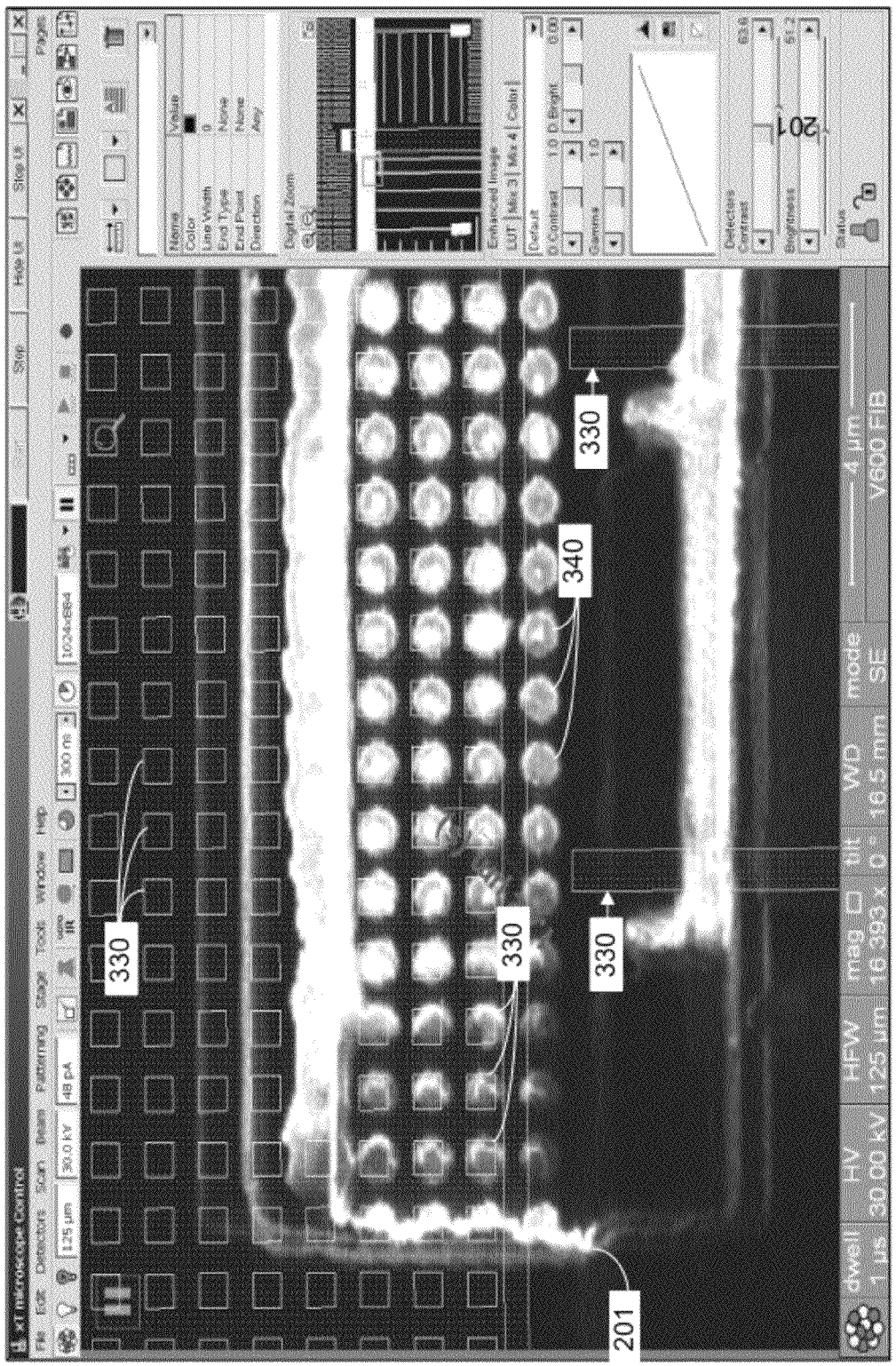
FIG. 4 shows the image and the CAD overlay of FIG. 3 at a higher magnification using digital zoom.

Typically, as shown in FIGS. 3 and 4, the initial positioning of the overlay relative to the image will likely be somewhat inaccurate. In optional step 18, digital magnification can be used to zoom in on the target and the alignment points. Once the target area has been scanned, the use of digital zoom allows a user to "navigate" the scanned image to locate fiducials or the feature of interest. It is much quicker and easier to navigate around in the image than it would be to navigate by moving the stage and re-imaging the sample. Digital zoom (for example, on the order of 8:1 zoom in FIG. 4) allows the user to quickly locate the general area containing a feature of interest and then to zoom in to more accurately locate the feature of interest, alignment features for use with the coordinate overlay, and/or transfer fiducials as described below. In FIG. 4, the magnified image makes it clear that the vias 340 are not properly aligned with the CAD polygons 330.

In preferred embodiments of the present invention, the use of digital zoom allows an operator to zoom in on the image (and the CAD overlay) at or near the feature of interest in order to perform a coordinate system registration between the image and the overlay in order to more accurately align the image with the CAD overlay. As persons of ordinary skill in the art will recognize, the use of digital zoom helps overcome inherent limitations in the level of detail that can be visually displayed to a human operator, for example on a computer monitor. In some preferred embodiments of the present invention, however, automated computer control can be used instead of human operators, for example by using methods of computer analysis of image data such as image recognition/machine vision. The use of digital zoom would obviously not be necessary for automated embodiments.

Figure 5:
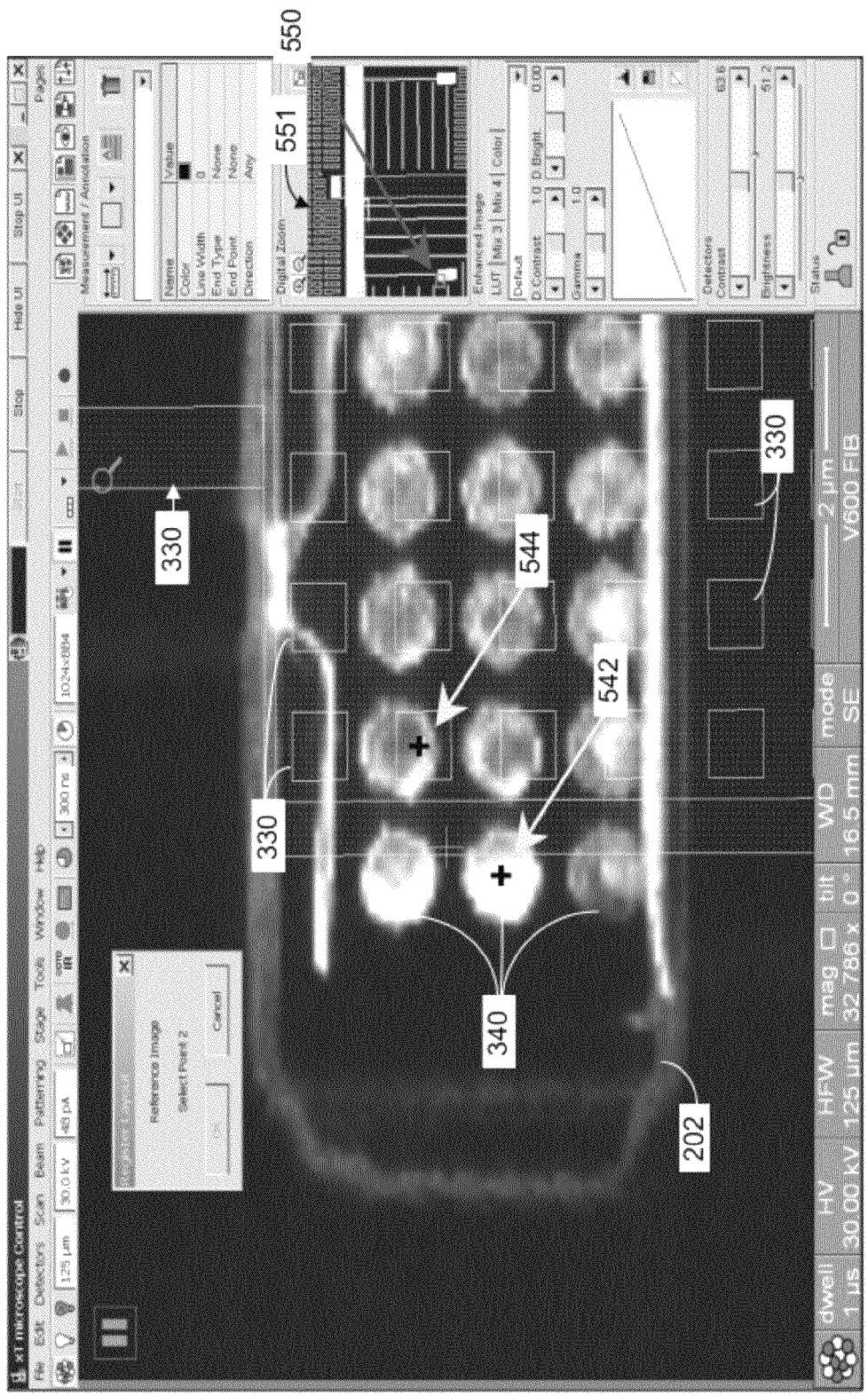
FIG. 5 shows the image of FIG. 4 in which a first point in the CAD overlay and the corresponding feature in the image have been selected for a registration of the image and the CAD overlay.
Figure 6:
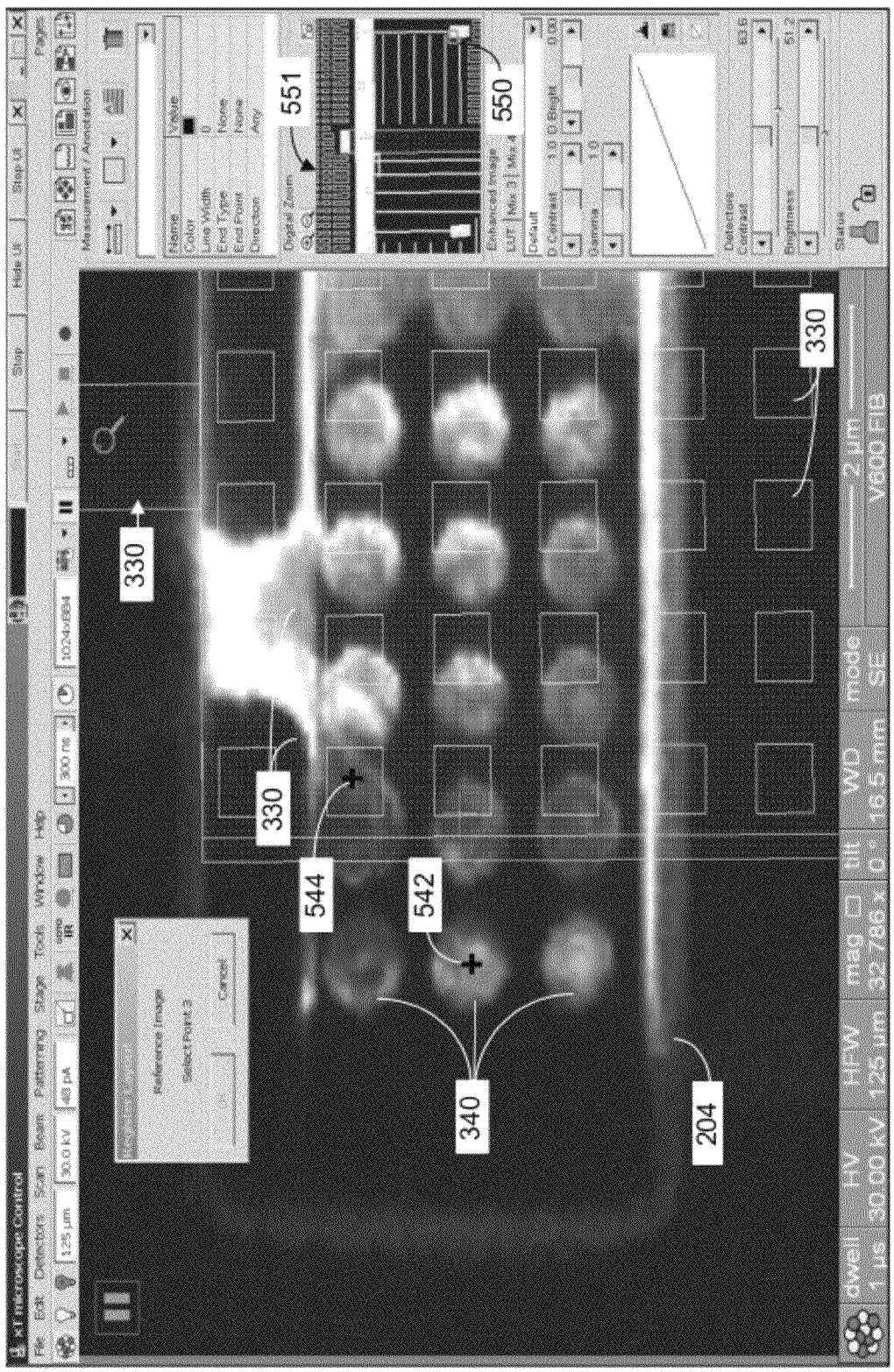
FIG. 6 shows the image of FIG. 4 in which a second point in the CAD overlay and the corresponding feature in the image have been selected for a registration of the image and the CAD overlay.
Figure 7:
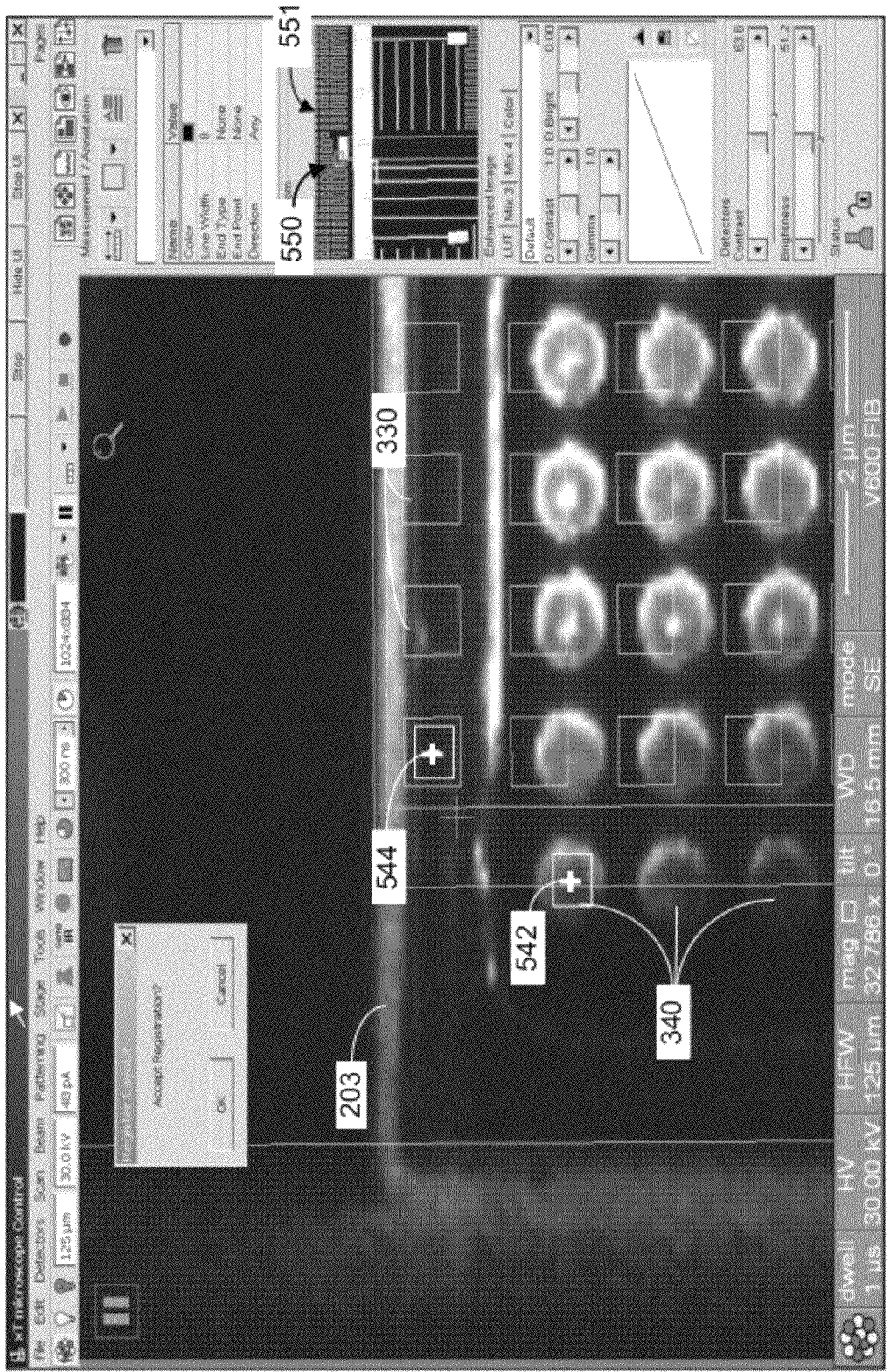
FIG. 7 shows the image of FIG. 4 in which a third point in the CAD overlay and the corresponding feature in the image have been selected for a registration of the image and the CAD overlay.

The alignment points and corresponding elements on the coordinate system overlay can then be identified, for example by using a computer pointing device such as a mouse and on-screen cursor. FIG. 5 shows the first step in the re-registration process. Using digital magnification, the user can zoom-in on the image and CAD overlay and specify a local offset for various regions within the image. The region that is being digitally magnified is shown as a square 550 in thumbnail view 551. As shown in FIG. 5, the image has been digitally zoomed at alignment point 202. Referring again to FIG. 1, in step 20—as illustrated in FIG. 5—an operator can click (with a mouse or other suitable pointing device) the center 544 of one of the CAD polygons 330 and then click in the center 542 of the corresponding feature (via 340) in the sample image. The process is can then be repeated for alignment feature 204 as shown in FIG. 6 (step 22) and at alignment feature 203 as shown in FIG. 7 (step 24).

Once the locations of the alignment features and the corresponding elements in the coordinate system overlay have been identified, the offset or overlay error in the target region between the alignment points on the image and the CAD overlay can then be measured in step 26. The error in FIG. 4 is about 1.4 μm in the target region. To correct this error, a three-point re-registration will be performed in step 28 and the CAD overlay is stretched, rotated, and/or shifted to create a match to the image.

As persons of ordinary skill in the art will recognize, the offset errors between the CAD overlay and the image can arise from many sources: operator error in the original stage lock, imprecise calibration of the FIB image (magnification and/or rotation), local die distortions, or non-linearities in the ion column deflection system, to name a few. Whatever the source of the errors, it is usually impossible to achieve perfect correspondence between a CAD overlay and every point within a large field-of-view FIB image. One solution to this problem is to perform a 3-point re-registration that stretches, shifts, and/or rotates the CAD overlay as needed to create a customized match of a particular FIB image. This type of image registration is discussed in detail in U.S. Pat. No. 5,541,411 to Lindquist et al. for "Image-to-Image Registration Focused Ion Beam System," assigned to FEI Company of Hillsboro, Oreg., also the assignee of the present invention, and incorporated herein by reference.

As described by Lindquist and as shown by FIGS. 5-8, the registration operation comprises selecting, for example, three points on the particle beam image and three corresponding points on the other image to be aligned (such as a CAD overlay according to a preferred embodiment of the present invention). The alignment points can be selected interactively via use of mouse in conjunction with visual feedback from display. For example, if alignment points R1, R2, and R3 are chosen as alignment points visible in the particle beam image, the three corresponding points (C1, C2, C3) are selected the coordinate system overlay for which registration is desired. Once the corresponding points in the image and coordinate system are chosen, the process determines a transform T between the points of the reference image (R1, R2, R3) and the points on the prior image (C1, C2, C3) such that T(C1)=R1, T(C2)=R2, and T(C3)=R3. Since the coordinate locations of the points are known within the particular coordinate system of the screen, the transformation between points is readily determined by linear algebra methods.

Once the transform operation T has been determined, then a new empty (i.e., blank) image is created, then a loop is entered and a first pixel is selected in the new image. Once the pixel is selected, a determination is made as to whether all pixels have been processed. If all pixels have been processed, then the registration is completed and the process exits. However, if all pixels have not been processed, then the process continues using the coordinate transform T and a corresponding pixel from the prior image is selected. The selected pixel data from the prior image is then read from the prior image into the selected pixel position of the new image. If the transform has mapped the selected position of the new image outside of the boundary of the prior image, then null data is placed in the new image position. This null data could comprise a blank representation or a black background representation, for example. Next, the process loops back, to again select a next pixel in the new image and the process continues in an iterative manner until such time as all pixels in the new image have been processed.

Figure 8:
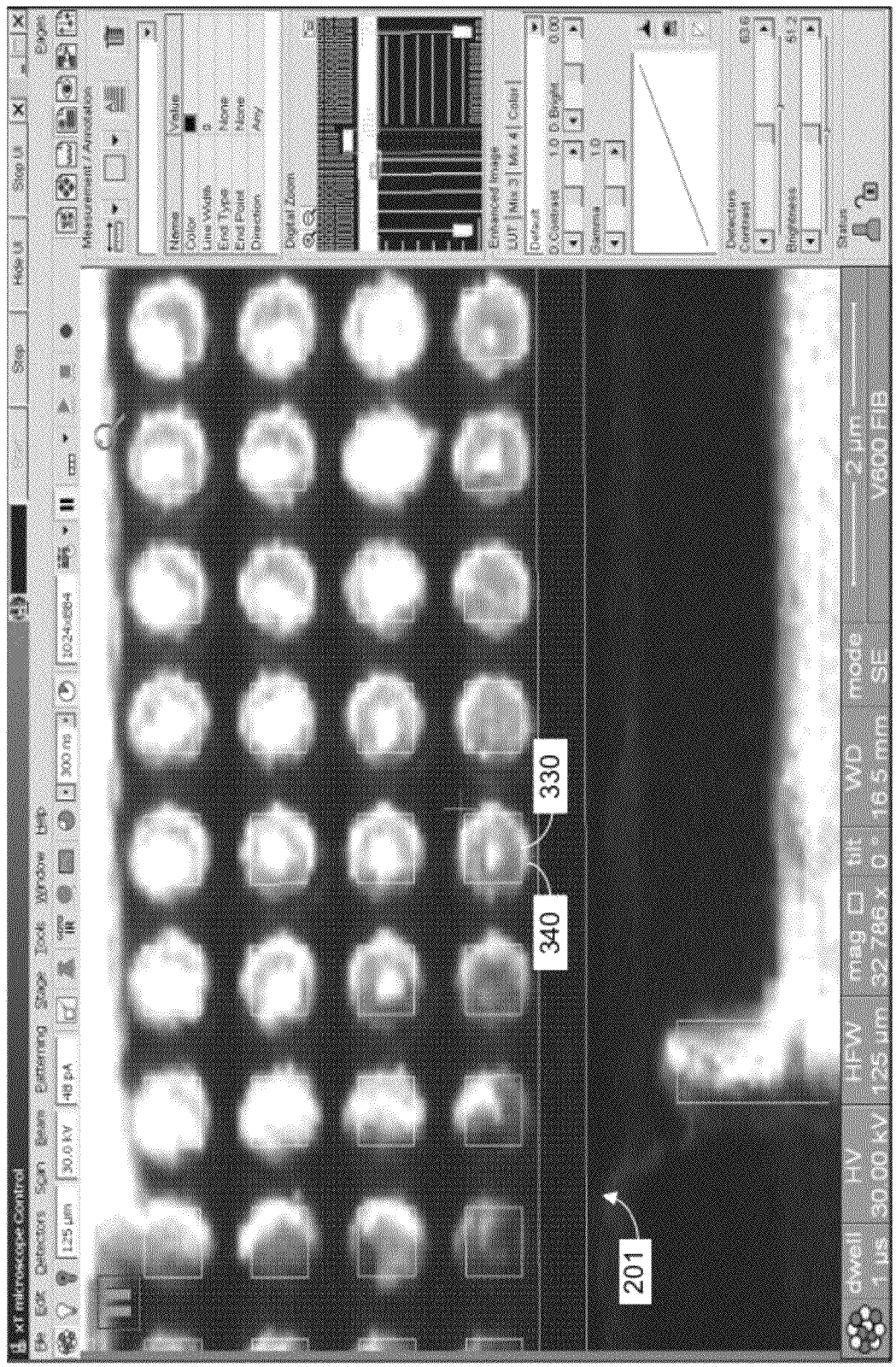
FIG. 8 shows the image and CAD overlay after 3-point registration has been completed.

In a preferred embodiment the calculation of offset and the registration of the image and CAD polygons are performed by way of an automated computer script. After registration is complete, the overlay and target vias are now properly aligned, as shown in FIG. 8.

The new image may be somewhat skewed relative to the original images, since the transform operation will accommodate translation, rotation, scaling, and tilt angle differences between the images. According to the above-described steps, image-to-image registration is preferably accomplished by selecting three corresponding alignment points in the charged particle image and the coordinate system, although different numbers of alignment points could be used with more points providing a more accurate alignment. A transformation between the corresponding alignment points is determined and applied to the images to be registered to produce an appropriately registered output image. Alternatively, an optional step to improve accuracy is to image additional sites with other alignment features close to the target site. The target site is then determined by averaging the position indicated by the separate images. This step is especially desirable to providing good accuracy when a single alignment features is used per image. The steps are suitably performed by a computer processor, wherein the various images are bit-mapped images stored in image buffer and shown on an appropriate display.

Once the image and the coordinates system have been properly aligned, that alignment then needs to be "transferred" to the sample itself. According to preferred embodiments of the present invention, this can be accomplished by the use of transfer fiducials. Factors such as system drift and image shifts and scaling differences when changing fields of view make the positioning of a charged particle beam somewhat variable at the nanometer scale. The use of transfer fiducials allows independent reference points to quickly and precisely locate a feature of interest. A transfer fiducial can either be an existing and easily identifiable feature on the sample (as seen in the image) or one created by the FIB/SEM as part of the alignment process. An existing feature suitable for use as a transfer fiducial should be a unique feature within the field of view that can be consistently identified. A preferred fiducial will also allow the beam location to be pinpointed in both the x and y directions. For example, one suitable fiducial might be the intersection of two lines (a cross-shaped fiducial). A suitable fiducial could also be an irregularity in the sample or even a piece of dirt or debris located within the field of view.

Referring again to FIG. 1, in step 30, after navigating to the location of the feature of interest within the image, one or more suitable transfer fiducials are identified in the image, and the offset between the fiducial(s) and the feature of interest within the image is recorded. Again, digital zoom can be used to magnify the image of the area at the location of the feature of interest to aid in the location of appropriate transfer fiducials. Preferably, two or more transfer fiducials will be used. In general, the greater the number of transfer fiducials used, the greater the accuracy of the location of the feature of interest.

If an appropriate structure is not present on the surface of the sample, in step 32 a fiducial mark can be created at a location within the field of view but separated from the feature of interest, preferably in a location that will not damage the point of interest. For example, a fiducial marker can be created on the sample by FIB milling or FIB/SEM deposition close to the target site. A fiducial may be created using any suitable method, including for example, focused ion beam sputtering, surface staining with an ion beam, gas-assisted etching or deposition, or electron beam induced gas-assisted etching or deposition. In many cases, fiducial formation by deposition will be preferable because it is less invasive (causes less damage to the sample surface) and provides a better contrast (because a different material is used). The fiducial can be made of a shape that is readily distinguishable so that it can be consistently identified and located.

Where an appropriate fiducial is created, in step 33, the sample surface should be re-imaged after the fiducial is created. The alignment steps 16-28 described above can then be repeated with the new image.

Figure 9:
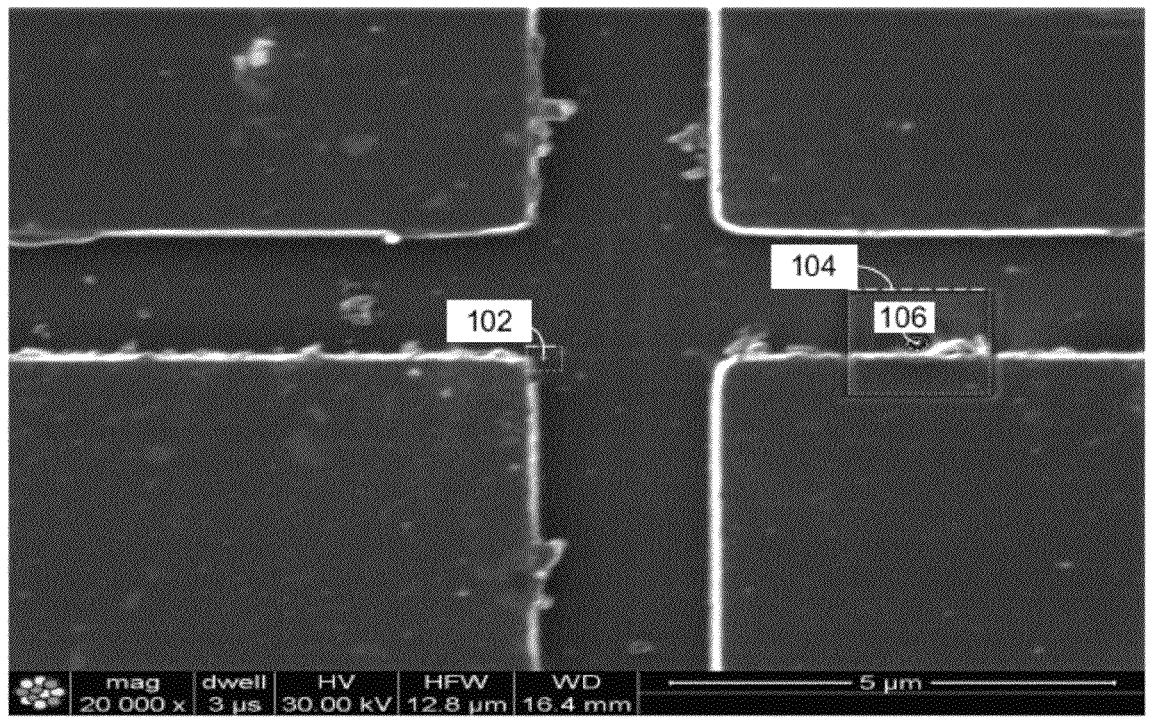
FIG. 9 shows a second charged particle beam image according to the present invention where the image has a smaller field of view and includes the location of the feature of interest and at least one feature that can be used as a transfer fiducial.

In step 34, once suitable transfer fiducials are identified, the offset between the transfer fiducials and feature of interest is determined and recorded (preferably in computer memory). FIG. 9 shows a sample where the corner 102 of a cross pattern has been located using the method described above and two milled fiducials 104 and 106. Using the methods described herein, the location of corner 102 was experimentally determined within <100 nm.

Figure 10:
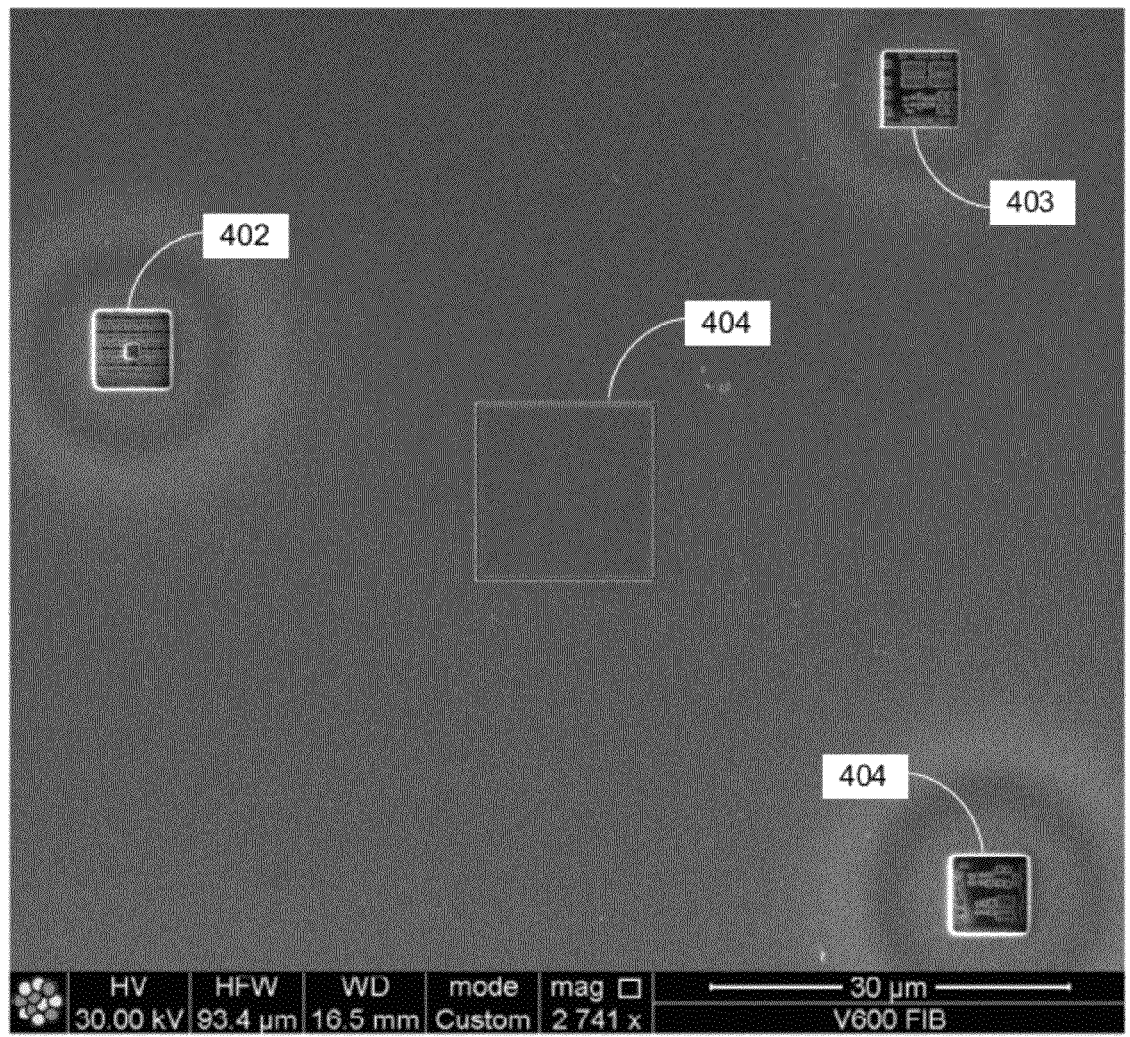
FIG. 10 shows a charged particle beam image according to the present invention where a fiducial frame has been milled around the location of the feature of interest.

Again, the greater number of fiducials created and used, the greater the accuracy of the beam placement in relation to the feature of interest. In a preferred embodiment, a frame or box can be created, for example by ion milling, completely around the location of the feature of interest (although as shown in FIG. 9, frame fiducial 104 was milled around alignment mark 106 rather than the feature of interest 102). Such a milled fiducial frame is shown in FIG. 10, where a buried feature of interest (not yet visible because of the surface layer) is located within fiducial frame 404. Alignment features 402, 403, 404 (which have already been exposed) are also visible in FIG. 10. By using a framing fiducial as shown in FIG. 10, once the feature of interest within the frame is exposed (preferably by milling/etching away the surface layer within the frame) the feature offset can be determined for any point along the frame, essentially providing an infinite number of fiducial locations from which the offset can be determined. This provides for a much more accurate determination of the offset between the fiducial and the feature of interest.

Referring again to FIG. 1, once the appropriate fiducials have been selected or created, in step 36, the sample is re-imaged at the location of the feature of interest. Preferably, a significantly smaller field of view is used for this imaging step. Typically, the field of view will be one that is typical for the desired processing of the feature of interest, for example a 10 μm×10 μm field of view. This smaller field of view can be used with greater confidence because, after the registration steps described above, the location of the feature is known with enough accuracy to ensure that the feature will be within the smaller field of view. The transfer fiducial(s) can then be readily identified in the new image in step 38. And in step 40, the recorded offset(s) are used to easily and accurately locate the feature of interest. Once the beam is correctly positioned, in step 42, the particle beam can be used to process the sample by, for example, milling the sample, depositing material onto the sample, or imaging and performing metrology on the sample.

Figure 11:
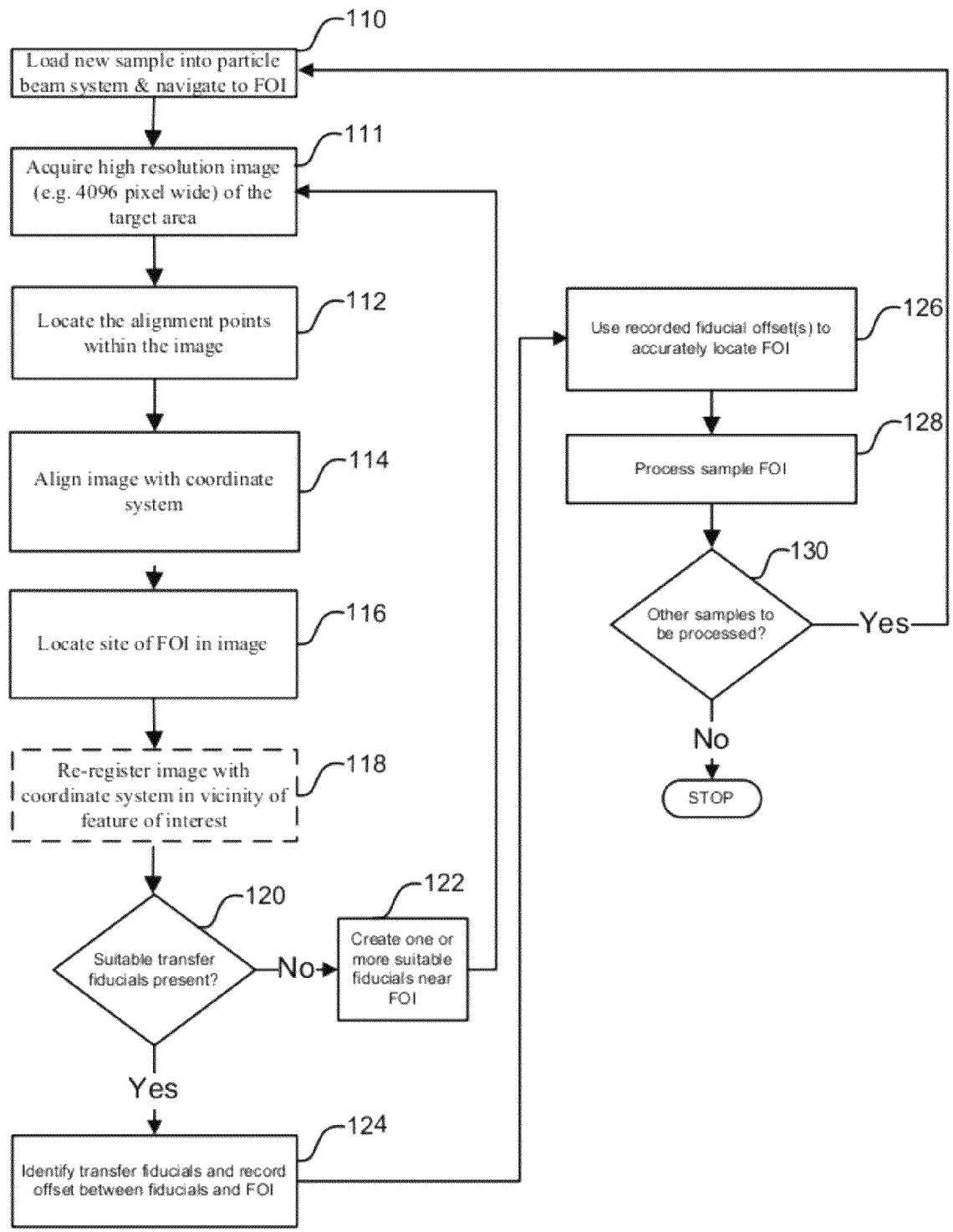
FIG. 11 is a flowchart showing the steps of high accuracy beam placement for local area navigation according to a preferred embodiment of the present invention.

FIG. 11 is a flowchart showing the steps of creating one or more samples according to another preferred embodiment of the present invention (without using a visual overlay of CAD polygons). Preferably, the process described in FIG. 11 can be completely or partially automated.

In step 110, a sample is loaded into a particle beam system. For example, a suitable sample could be a semiconductor wafer, which could be loaded into a dual beam FIB/SEM having a sample stage with an accuracy of only 1-2 μm. The known coordinates of a feature of interest are then used to position the stage so that the feature of interest is within the field of view of the particle beam. Because of the low accuracy of a typical sample stage, the precise location of the feature of interest cannot be identified with sufficient accuracy using coordinates alone.

In step 111, a high-resolution image (e.g. 4096 pixel wide) image of the target area is acquired, including two or more alignment points (e.g. identifiable features such as the corners of a 200×200 μm square area). In step 112, the suitable alignment points are located. As described above, suitable alignment features can be identified in the sample image and corresponding elements identified in coordinate system data specifying the locations of features on the sample (such as CAD data for the particular semiconductor wafer).

According to a preferred embodiment of the present invention, suitable alignment features also can be selected automatically using image recognition software. Suitable image recognition software is available, for example, from Cognex Corporation of Natick, Mass. Image recognition software can be "trained" to locate the suitable alignment features by using sample images of similar features or by using geometric information from CAD data. This can be especially desirable where a number of similar samples are to be processed (for example a large number of semiconductor wafers having the same design). Automated FIB or SEM metrology can also be used to identify or help identify the alignment features. Metrology may consist of image-based pattern recognition, edge finding, ADR, center-of-mass calculations, blobs, etc. Suitable software to implement fully or partially automated image processing, metrology, and machine control according to the present invention preferably provides pattern recognition and edge detection tools, along with "do while" looping capabilities, such as the IC3D™ software also available from FEI Company, the assignee of the present invention.

In step 114, the image and the coordinate system of the alignment points are aligned based on calculation of the offset as described in greater detail above. In step 116, this alignment is used to calculate the location of desired feature of interest in image. In optional step 118, a re-registration can be performed in the vicinity of the feature of interest.

In step 120, it is determined whether suitable transfer fiducials are present on the sample surface. Again, transfer fiducials can be selected automatically using image recognition software. Alternatively, suitable transfer fiducials could be selected initially by an operator and the image recognition software "trained" to locate the suitable transfer fiducials in subsequent samples.

If suitable transfer fiducials not present, in step 122, a physical fiducial is created to allow target location. The fiducial can be created to the side of the target area, for example with FIB, SEM, or other known methods, as described above. The offset to the marker should be large enough to make sure that the target site will not be damaged or obscured by the marker. Depending upon the accuracy of the stage, the fiducial might need to be formed several μm away from the feature of interest. The locations for created transfer fiducials could be specified by an operator, for example, by using a mouse to drag a virtual box around the desired fiducial location. Automated metrology software could then precisely measure the location of the fiducial with respect to identifiable features at the sample location (for example 15 nm from the right edge of a particular feature). For processing subsequent samples, a fiducial could then be automatically created at the precise location specified. A fiducial location could also be specified using CAD data to specify the location of the fiducial with respect to a particular structure on the wafer surface. As long as the transfer fiducials were created far enough away from the feature of interest (considering the accuracy of the stage navigation) suitable transfer fiducials could be safely created by this type of automated process.

Where transfer fiducials are created, a second high-resolution image can be acquired and process steps 111-118 repeated in order to properly register the second image (showing the transfer fiducials) with the coordinate system.

In step 124, the suitable transfer fiducials (whether pre-existing or created) are then identified and the offset(s) between the transfer fiducials and the feature of interest are recorded.

In step 126, the recorded fiducial offsets are used to accurately locate the feature of interest so that the particle beam can be precisely positioned. One method of performing the final alignment would be to create an overlay over the fiducial in the high-resolution image, for example by drawing a pattern box. If the user now acquires an image at higher at higher magnification, the target site can be found by lining up the marker and the pattern, e.g. by using beam shift. By using this novel process, the feature of interest can be located and particle beam placement controlled within ±30 nm or even less. This allows the sample to be processed, in step 128, with very accurate beam placement even though the sample stage alone is not capable of such precise navigation. In step 130, it is determined whether there are other samples to be processed. If yes, subsequent samples are loaded into the particle beam system and steps 111-130 are repeated (preferably automatically as described above). If not, the process stops.

Preferred embodiments of the present invention can also be used to rapidly navigate to one single bit cell in a memory array or similar structure, for example to characterize or correct a defect in that individual bit cell. A typical bit cell might be on the order of 50 nm in size, while the total array might have an area of 100 μm×100 μm. In systems without an expensive, high-accuracy laser stage, navigation to an individual cell location is currently done manually, by slowly moving the stage and counting the cells manually, along both the X-axis and Y-axis, until the desired location is reached. Such a manual process may take up to 10 minutes to drive to a specific cell, and is also prone to error resulting from miscounting or accidental misalignment. Smooth jogging stages can minimize such counting errors, but these types of stages are expensive and not in widespread use.

Automatic navigation, for example analyzing the image data and/or using pattern recognition to automatically count the cells, would require imaging the array at a resolution sufficient to resolve features down to the size of the minimum repeating dimension of the cells—in this example down to 50 nm. In order to have sufficient resolution to reliably perform pattern recognition on 50 nm cells, the array would preferably be imaged at a resolution of at least 16K, possibly even as high as 64K. Such a high-resolution scan (64K) of a 100 μm×100 μm array (at a dwell time of 500 ns) would take approximately 34 minutes.

Preferred embodiments of the present invention, however, use high-resolution scanning, not of the entire array, but only of a "strip" of cells on the edges of the array (along either the X axis and the Y axis) to locate a row containing the desired cell followed by a similar high-speed scan of a strip of cells along the located row (in the other direction) until the desired cell location is reached. Preferably, the "strips" are substantially smaller than the size of the array. For example, a preferred strip would be less than 10 cells wide, more preferably less than 5 cells wide. For a typical array, this would make the strips less than 10% of the size of the array. This allows pattern-recognition tools to be used to automatically "count" the cells necessary to navigate to the desired cell, without the large expenditure of time required to image the entire array. Using preferred embodiments of the present invention, a single bit cell can typically be located automatically in less than 5 minutes.

Figure 13:
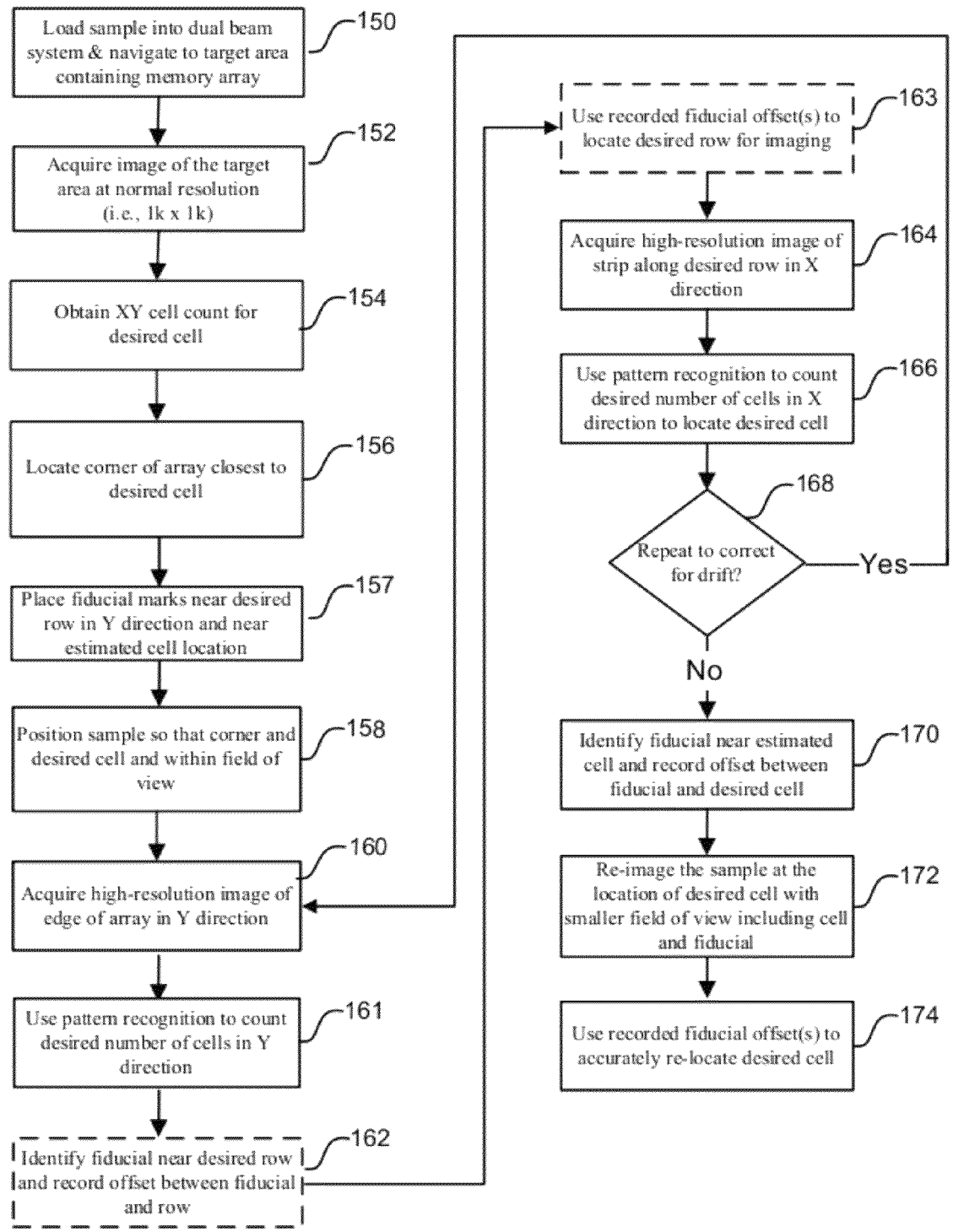
FIG. 13 is a flowchart showing the steps of navigating to a single bit cell in a memory array or similar structure according to a preferred embodiment of the present invention.

FIG. 13 is a flowchart showing the steps of navigating to a single bit cell in a memory array or similar structure according to a preferred embodiment of the present invention. Preferably, the process described in FIG. 13 can be completely or partially automated.

Figure 14:
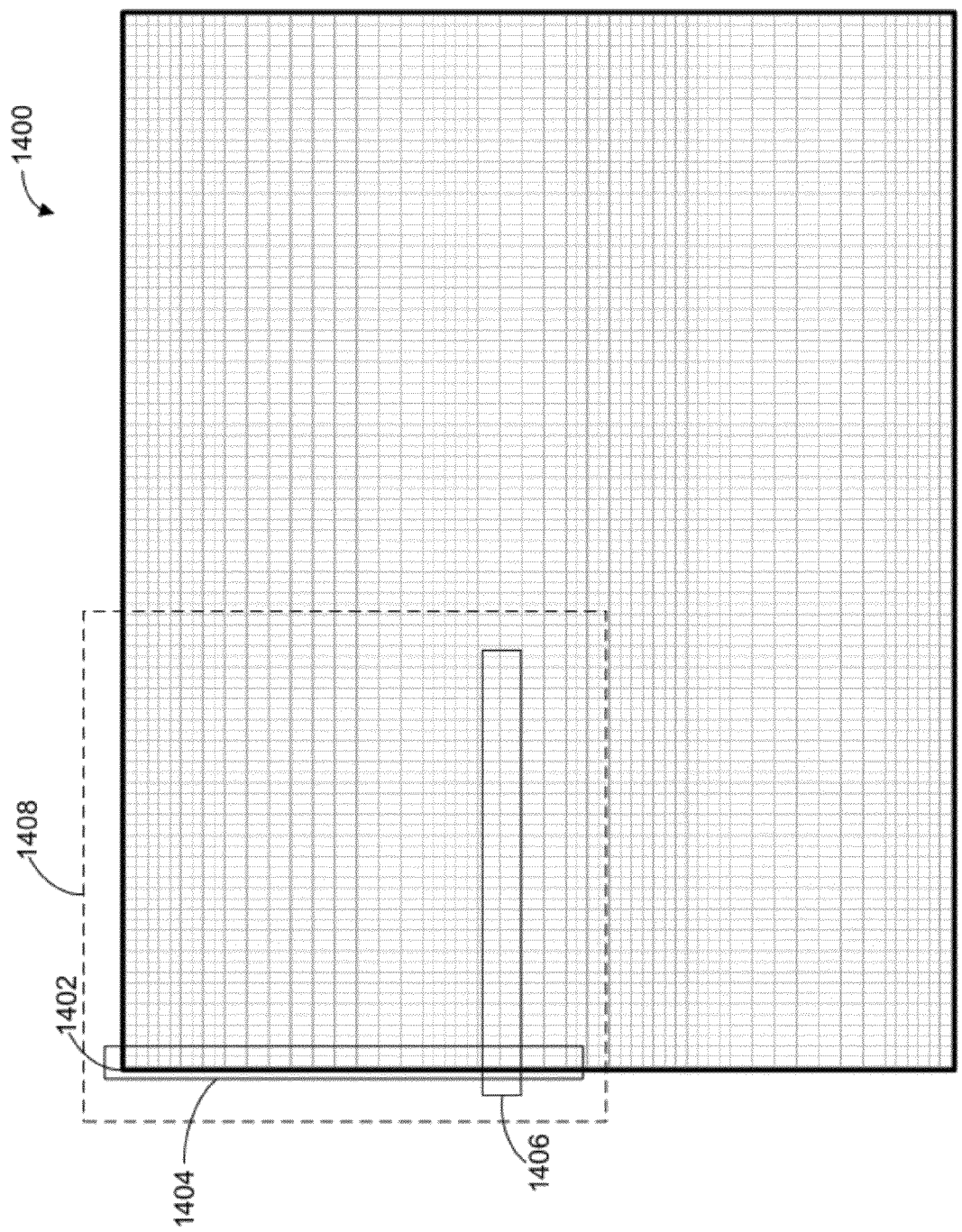
FIG. 14 shows a schematic representation of a memory array containing individual cells.
Figure 15:
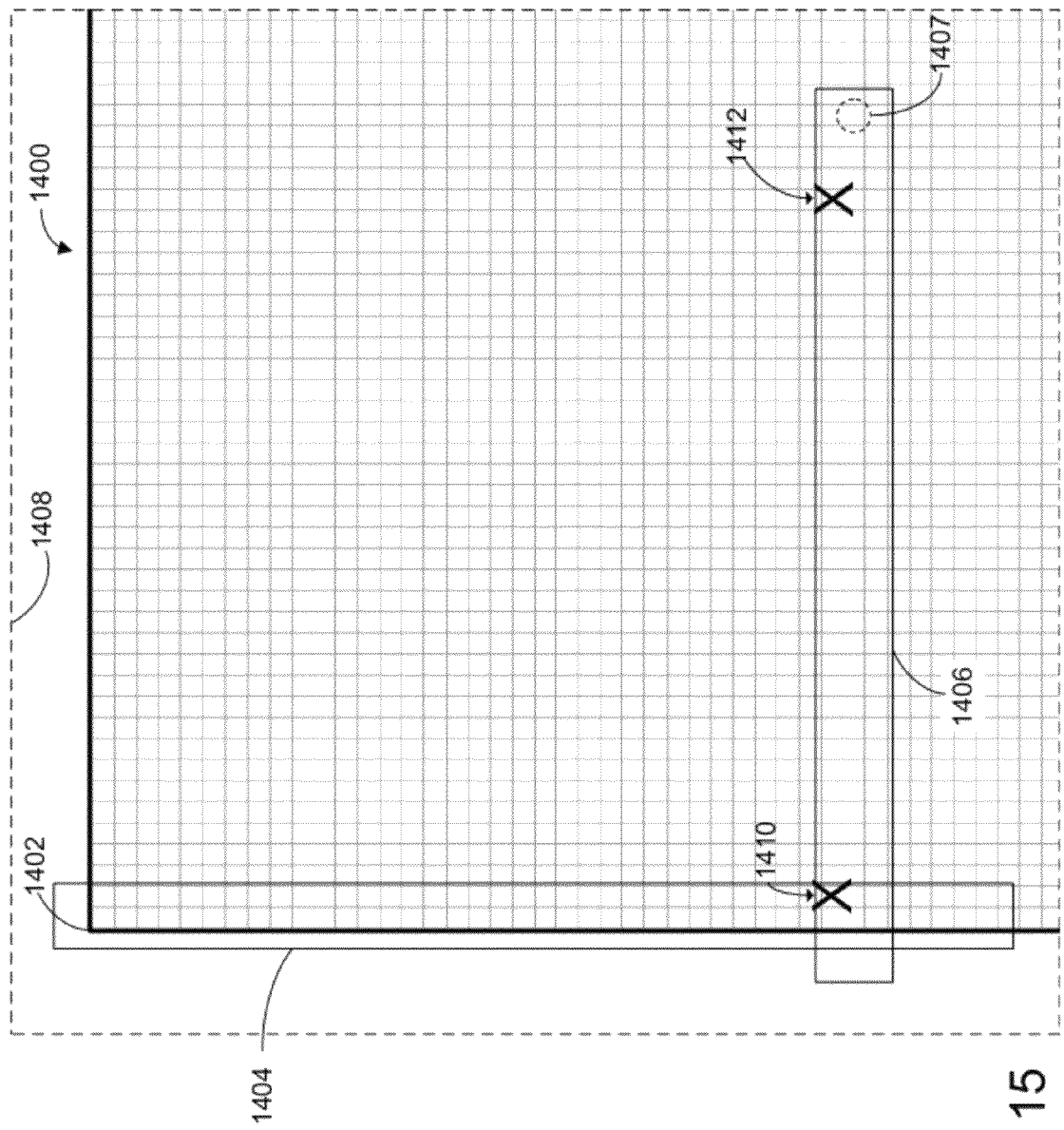
FIG. 15 is a close-up view of a portion of the memory array of FIG. 14.

In step 150, a sample is loaded into a dual beam SEM/FIB particle beam system, and the beam system is directed at the region of interest. For example, a suitable sample could be a semiconductor wafer having a memory array or similar structure as a region of interest. In step 152, the SEM is used to image the sample to find and identify the desired area (i.e., the target area) containing the desired cell. For example, the SEM could be used to image a 200 μm×200 μm area using a normal resolution of 1K×1K. It would not be possible to identify individual 50 nm cells in such an image because the pixel size would be 200 nm. FIG. 14 shows a schematic representation of such an area 1400, in which the individual "squares" represent individual cells in a memory array or similar structure. FIG. 15 shows a close-up view of the area 1400 within the dashed box 1408.

In step 154, the XY cell count for the desired cell is provided. For example, a typical cell count number within the field of view might be cell x=2478, y=399, and this count could be provided by an operator or by CAD data. In step 156, the corner of the array (lower left, lower right, upper left or upper right) closest to the desired cell is determined, for example by automatic software. Next, in step 157, one or more fiducials can be formed on the substrate, one preferably in the vicinity of the first "row" to be counted (for example, at or near row y=399) and one near the location of the desired cell. Skilled persons will recognize that the first "row" to be counted can be either the X value or the Y value, with the other value being used to count along the located row to reach the requested cell location. Because the precise location of the requested cell has not yet been determined, the positioning of the fiducial(s) can be somewhat rough as long as both the fiducial and desired row/cell location will definitely be within the field of view.

Referring also to FIG. 15, fiducial markers 1410, 1412 will preferably be placed so that they are in the image "strip," discussed below, but separated from the desired cell, preferably in a location that will not damage the feature of interest. Depending upon the accuracy of the stage, the fiducial might need to be formed several μm away from the feature of interest to make sure the feature is not inadvertently destroyed. A fiducial may be created using any suitable method, including for example, focused ion beam sputtering, surface staining with an ion beam, gas-assisted etching or deposition, or electron beam induced gas-assisted etching or deposition. In many cases, fiducial formation by deposition will be preferable because it is less invasive (causes less damage to the sample surface) and provides a better contrast (because a different material is used). The fiducial can be made of a shape, such as a box or "X," that is readily distinguishable so that it can be consistently identified and located, especially in a lower resolution imaging scan.

In some circumstances, it may be difficult to estimate the desired location for the fiducial marks with sufficient accuracy, and thus it may be necessary to create the fiducial marks after the proper "row" and/or desired cell location has been determined. In that event, the sample should be re-imaged at a high-resolution to account for sample drift before the offset between fiducial and desired row or cell location can be determined.

In step 158, the system (either automatically or manually) can position the sample stage so that the center of the field of view is at a middle location between the closest corner and the desired cell location. It may also be desirable in some circumstances to create the fiducials discussed above after this step. But in that case, the field of view should be reimaged at least at the lower resolution (for example, at 1K×1K) to account for any error in stage movement.

In step 160, starting at the closest corner, a high-resolution scan is used to acquire an image along the edge of the array, in either the X or Y direction. Referring also to FIG. 14, the high-resolution scan could be made along the area defined by box 1404 in the Y direction. Preferably, the scan resolution will be at least 16K×1K, which will allow pattern recognition of individual 50 nm cells because pixel size will be down to 6 nm. Thus, in step 161, pattern recognition software can be used to count the desired number of cells, for example 399 cells in the Y direction using the example above. In some preferred embodiments, the cells can be counted as the strip is imaged. In other preferred embodiments, a strip will be imaged to a length that will definitely include the desired row, and the pattern recognition software can be used to count the desired number of cells in the image.

Once the proper row is identified, the offset between the fiducial and the row can be optionally recorded in step 162 so that the row can be more easily relocated when the next scan is acquired. In a system with a relatively large amount of sample drift, a row-marking fiducial is desirable because it allows accurate placement of the next imaging scan (in optional step 163). In a system without much sample drift, a row-marking fiducial might not be needed. Preferably, the row-marking fiducial, if required, will be placed is a location that will be scanned by both image strips.

Next, in step 164, a high-resolution scan is used to acquire an image along the row located in the previous step (for example, in the X direction in the example above). Referring also to FIG. 14, the high-resolution scan could be made along the area defined by box 1406 in the X direction. Again, this scan should be at a resolution high enough to allow pattern recognition on the cells of the array. As above, scan resolution of at least 16K×1K will allow pattern recognition of individual 50 nm cells, thus allowing pattern recognition software to count the desired number of cells as the strip is imaged in step 166. For example, using the XY coordinates above, 2478 cells in the X direction could be counted by the pattern recognition software to locate the desired cell x=2478, y=399 (shown within dashed circle 1407). For clarity, all of the cells in this example are not shown in FIGS. 14-15. Again, in some preferred embodiments, the cells can be counted as the strip is imaged. In other preferred embodiments, the strip will be imaged to a length that will definitely include the desired cell location, and the pattern recognition software can be used to count the desired number of cells in the image.

To compensate for possible drift during the previous steps, it may be desirable to repeat the scanning and cell location steps described above. Accordingly, in step 168, if necessary to correct for possible drift, steps 160 to 166 can be repeated.

In step 170, once the location of the desired cell has been determined, the fiducial near the desired cell is identified and the offset between the fiducial and the desired cell is determined and recorded. (In some preferred embodiments, a plurality of fiducials near the desired cell can be used.) Whenever an offset between a desired location on this type of memory array and a fiducial is determined, the offset may be expressed in numbers of cells (for example, 2 cells down and 1 cell to the right). In other preferred embodiments, the offset may be expressed in terms of absolute distance or even as relative distance when fiducials on either side of the target are used.

Once the relationship between the position of the desired cell and the fiducial(s) is known, the desired cell can be easily re-located. Typically, for example, an image with a field of view that is as much as 100 μm wide would not be used for particle beam processing of a feature. Instead, a more magnified image having a smaller field of view of, for example, 10 μm would be used. Accordingly, in step 172, the sample could be re-imaged with a smaller field of view (including both the desired cell and the fiducial) and the recorded offset used to easily locate the desired cell in the new image (step 174). Thus, even if the stage is moved or the focus and/or field of view changed, the desired cell can be easily and rapidly re-located without counting the cells, even when the sample is imaged at a resolution in which the individual cells cannot be identified (as long as the fiducial can be identified in the image).

It should be noted that in some cases, the process described above might be repeated multiple times with the images "stitched" together to find the actual desired cell. For example, in a very large array, the desired cell might have an address of y=399, x=7500. The method described above could be used to first locate cell address y=399, x=2500 and the offset between than cell and a fiducial recorded. Then a second iteration of the method could be used to image a different portion of the array to locate cell y=399, x=5000, and a third to locate the actual desired cell y=399, x=7500.

In some preferred embodiments, the process can be further simplified by locating the desired cell in one continuous scan, even though only a small portion of the overall array is actually scanned. For example, a preferred embodiment of the present invention might use a diagonal image, formed after calculating the cell location along a diagonal line from the closest corner (using the XY cell coordinates). This would only require imaging one strip along the diagonal, using pattern recognition to perform the cell counting within this diagonal strip, and forming a fiducial mark at or near the desired cell. As above, the diagonal imaging could be repeated twice (or more if necessary) to verify the cell location and compensate for sample drift. In another preferred embodiment, the scan along the edge of the array could be scanned, for example, using an image that is only a few cells wide for some distance along the edge, and then when the desired row (in which the feature of interest is located) is approached, the scan width could be increased to several hundred cells, depending upon the X, Y address of the desired cell.

Preferred embodiments of the present invention provide a significant timesaving over prior art methods. As discussed above, locating a particular cell in such a large memory array without using an expensive laser stage is a time consuming process. Manual cell counting can take 10 minutes or more and is prone to errors in counting, which of course can mean that the wrong cell is identified. Attempting to automate the process by using high-resolution imaging of the entire array (or even just the portion of the array containing the feature of interest) would be expected to be even more time consuming. For example, a high-resolution scan of an entire 100 μm×100 μm array might take more than 30 minutes. Using the method of the present invention, however, the time required for a high-resolution image of only two "strips" of cells in the array (or four separate strips when the process is repeated to compensate for drift) would only require around 2 minutes (~30 sec. per strip). Adding one minute for forming the fiducial(s) via GIS deposits will bring the total time to 3-4 minutes. Obviously the time could be reduced even further if only one strip (whether diagonal or L-shaped) is imaged as described above.

Preferred embodiments of the present invention do not rely on stage accuracy performance as would methods using expensive laser stages or stages capable of smooth jogging. This is significant because laser stages or smooth jogging might be made to work now, but would likely not be accurate enough as nodes and tolerances continue to shrink. In contrast, embodiments of the present invention are scalable to smaller nodes. As performance requirements shrink, it is typically necessary to increase imaging resolution correspondingly. Embodiments of the present invention will still be applicable as long as the achievable image resolution is great enough to allow pattern recognition of the individual cells. Although embodiments of the present invention could be used with any type of imaging technology, there are a number of techniques currently in development or use that will allow SEM resolution to be significantly improved (e.g., UHR mode, field stitching, beam deceleration, etc.).

Figure 12:
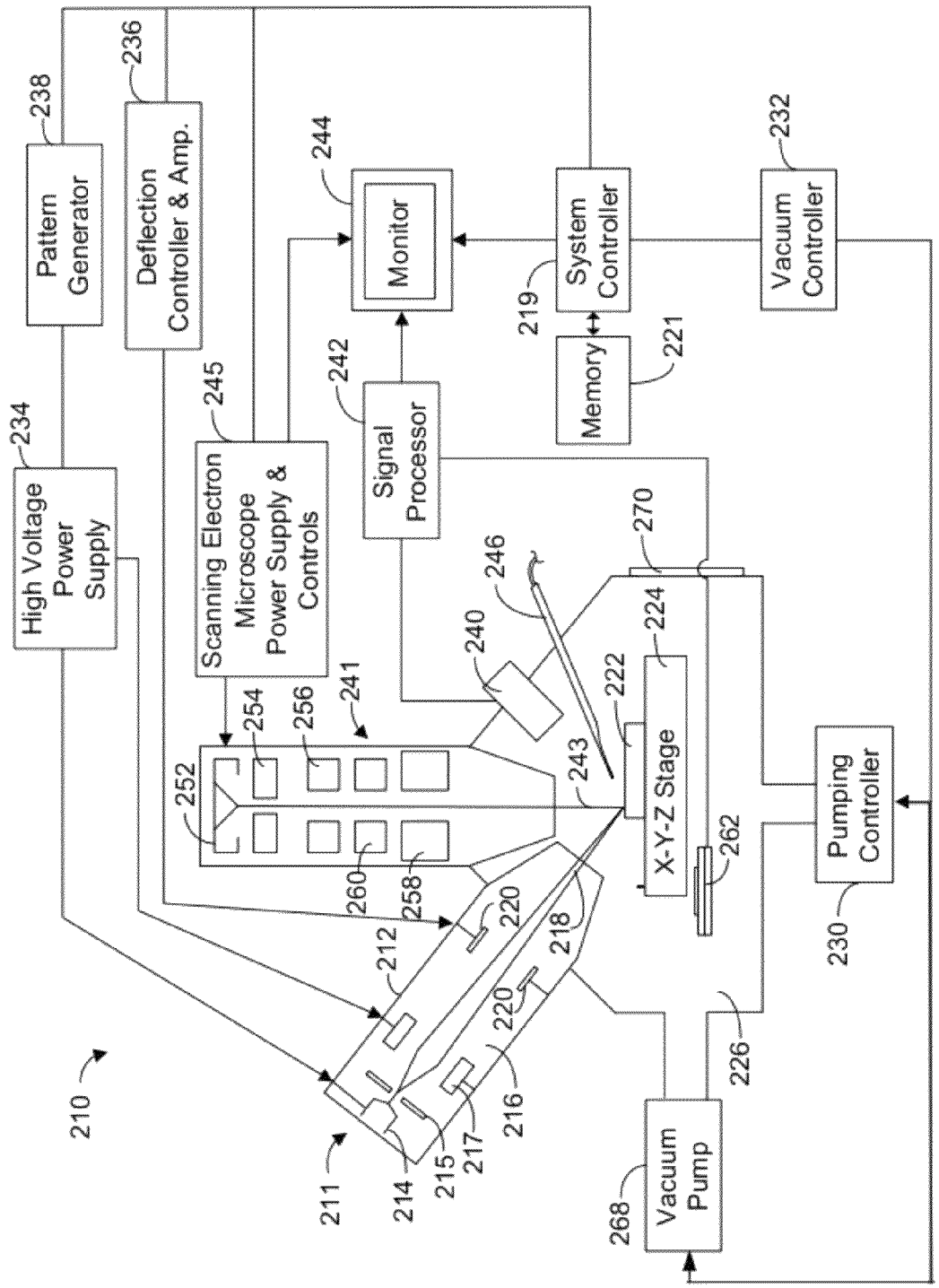
FIG. 12 shows a typical dual beam FIB/SEM system that could be used to implement aspects of the present invention.

FIG. 12 shows a typical dual beam FIB/SEM system 210 that could be used to implement preferred embodiments of the present invention. One embodiment of the present invention utilizes a dual beam FIB/SEM system 210 that uses an ion beam that is either normal or tilted by a few degrees to the plane of the sample surface and an electron beam having an axis that is also tilted, e.g., 52 degrees from the axis of ion beam. In some embodiments, the ion beam and electron beam are capable of aligning so that the fields of view of both beams are coincident to within a few microns or less. The ion beam is typically used to image and machine the work piece, and the electron beam is used primarily for imaging but can also be used for some modification of the work piece. The electron beam will typically produce an image of a higher resolution than the ion beam image, and it will not damage the viewed surface like the ion beam. The image formed by the two beams can look different, and the two beams can therefore provide more information than a single beam.

Such a dual beam system could be made from discrete components or alternatively, could be derived from a conventional device such as a Helios NanoLab™ system available from FEI Company of Hillsboro, Oreg. The present invention could also be implemented using other particle beam systems, including for example, single beam systems, such as FIB or SEM only systems, or dual beam systems having two FIB columns.

Focused ion beam system 210 includes an evacuated envelope 211 having an upper neck portion 212 within which are located an ion source 214 and a focusing column 216 including extractor electrodes and an electrostatic optical system. Ion beam 218 passes from ion source 214 through column 216 and between electrostatic deflection means schematically indicated at 220 toward sample 222, which comprises, for example, a semiconductor device positioned on movable X-Y-Z stage 224 within lower chamber 226. An ion pump or other pumping system (not shown) can be employed to evacuate neck portion 212. The chamber 226 is evacuated with turbomolecular and mechanical pumping system 230 under the control of vacuum controller 232. The vacuum system provides within chamber 226 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

High voltage power supply 234 is connected to ion source 214 as well as to appropriate electrodes in focusing column 216 for forming an ion beam 218 and directing the same downwardly. Deflection controller and amplifier 236, operated in accordance with a prescribed pattern provided by pattern generator 238, is coupled to deflection plates 220 whereby beam 218 may be controlled to trace out a corresponding pattern on the upper surface of sample 222. In some systems the deflection plates are placed before the final lens, as is well known in the art.

The ion source 214 typically provides a metal ion beam of gallium, although other ion sources, such as a multicusp or other plasma ion source, can be used. The ion source 214 typically is capable of being focused into a sub one-tenth micron wide beam at sample 222 for either modifying the sample 222 by ion milling, enhanced etch, material deposition, or for the purpose of imaging the sample 222. A charged particle multiplier 240 used for detecting secondary ion or electron emission for imaging is connected to signal processor 242, where the signal from charged particle multiplier 240 are amplified, converted into digital signals, and subjected to signal processing. The resulting digital signal is to display an image of sample 222 on the monitor 244.

A scanning electron microscope 241, along with power supply and control unit 245, is also provided with the FIB/SEM system 210. An electron beam 243 is emitted from a cathode 252 by applying voltage between cathode 252 and an anode 254. Electron beam 243 is focused to a fine spot by means of a condensing lens 256 and an objective lens 258. Electron beam 243 is scanned two-dimensionally on the specimen by means of a deflection coil 260. Operation of condensing lens 256, objective lens 258, and deflection coil 260 is controlled by power supply and control unit 245.

Electron beam 243 can be focused onto sample 222, which is on movable X-Y-Z stage 224 within lower chamber 226. Scanning electron microscope 241 produces a finely focused electron beam 243, which is scanned across the surface of the structure, preferably in a raster pattern. When the electrons in the electron beam 243 strike the surface of work piece 222, secondary electrons and backscattered electrons are emitted. Respectively, these electrons are detected by secondary electron detector 240 or backscattered electron detector 262. The analog signal produced either by secondary electron detector 240 or backscattered electron detector 262 is amplified and converted into a digital brightness value by signal processor unit 242. The resulting digital signal can be displayed as an image of sample 222 on the monitor 244.

A door 270 is opened for inserting sample 222 onto stage 224, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 216 for energizing and focusing ion beam 218.

A gas delivery system 246 extends into lower chamber 226 for introducing and directing a gaseous vapor toward sample 222. U.S. Pat. No. 5,851,413 to Casella et al. for "Gas Delivery Systems for Particle Beam Processing," assigned to the assignee of the present invention, describes a suitable gas delivery system 246. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

System controller 219 controls the operations of the various parts of dual beam system 20. Through system controller 119, a user can cause ion beam 218 or electron beam 143 to be scanned in a desired manner through commands entered into a conventional user interface (not shown). System controller 119 can also comprise computer-readable memory 221 and may control dual beam system 110 in accordance with data or programmed instructions stored in memory 221. CAD data concerning the sample/semiconductor stored in memory 221 can be used to create a CAD polygon overlay or other positional data used to locate a feature of interest and alignment points or transfer fiducials as described above.

Although the description of the present invention above is mainly directed at a method of high-accuracy beam placement for local area navigation, it should be recognized that an apparatus performing the operation of this method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application. However, even though much of the previous description is directed toward the use of FIB milling and imaging, the beam used to process the desired samples could comprise, for example, an electron beam, a laser beam, or a focused or shaped ion beam, for example, from a liquid metal ion source or a plasma ion source, or any other charged particle beam. Further, although much of the previous description is directed at particle beam systems, the invention could be applied to any suitable sample imaging system employing a moveable sample stage to navigate to the location of a sample feature.

Although much of the previous description is directed at semiconductor wafers, the invention could be applied to any suitable substrate or surface. Further, whenever the terms "automatic," "automated," or similar terms are used herein, those terms will be understood to include manual initiation of the automatic or automated process or step. Whenever a scan or image is being processed automatically using computer processing, it should be understood that the raw image data can be processed without ever generating an actual viewable image. The term "image" is used in a broad sense to include not only a displayed image showing the appearance of the surface, but also to include any collection of information characterizing the multiple points on or below a surface. For example, a collection of data corresponding to the secondary electrons collected when a particle beam is at different point on a surface is a type of "image," even if the data is not displayed. Collecting information about points on the sample or workpiece is "imaging."

In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

When the positional error or accuracy of the system stage or of beam placement or navigation is discussed herein, the terms ±100 nm (or ±30 nm or ±X nm) mean that the beam can be directed at a location on the sample within a maximum error of 100 nm (or 30 nm or x nm). The terms "accuracy of ±X nm" or "positioning accuracy of X nm or better" means that the accuracy is at least X nm and includes all smaller values. The term "accuracy of X nm or greater" means that the accuracy is at best X nm and includes all larger values.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus for accurately locating a feature of interest on a sample, comprising:
  a moveable sample stage for supporting the sample;
  a particle beam column for producing a beam of particles to image the sample; and
  a computer-readable non-transitory memory storing computer instructions, the instructions including a program for controlling the apparatus and causing the apparatus to carry out the steps of:
    (i) loading a sample into a particle beam system;
    (ii) navigating to the portion of the array containing the feature of interest;
    (iii) forming at least one fiducial on the sample surface at a location near the estimated location of the feature of interest;
    (iv) obtaining an image of an edge strip along an edge of the array, said edge strip image having a resolution high enough that the pixel size is less than half of the minimum repeating dimension of the cells in the array, and the edge strip image being at least X cells in length and substantially smaller than the field of view in the first image;
    (v) analyzing the image data to automatically count X cells along the edge of the array to determine the location of the desired row containing the feature of interest;
    (vi) obtaining a row strip image along the desired row, said row strip image having a resolution high enough that the pixel size is less than half of the minimum repeating dimension of the cells in the array, and the row strip image being at least Y cells in length and substantially smaller than the field of view in the first image, and the row strip image including at least one fiducial and the feature of interest;

(vii) analyzing the image data to automatically count Y cells along the desired row to determine the location of cell address X, Y containing the feature of interest; and (viii) determining the offset between the at least one fiducial and the location of cell address X, Y containing the feature of interest.

2. An apparatus for accurately locating a feature of interest on a sample, comprising:

a moveable sample stage for supporting the sample;

a particle beam column for producing a beam of particles to image the sample; and a computer-readable non-transitory memory storing computer instructions, the instructions including a program for controlling the apparatus and causing the apparatus to carry out the steps of:

(i) loading a sample into a particle beam system;

(ii) acquiring an image of at least a portion of the array at a first image resolution, the image having a field of view large enough to include the location of the feature of interest and at least one corner of the array;

(iii) forming at least one fiducial on the sample surface at a location near the estimated location of the feature of interest;

(iv) obtaining an image of an edge strip along an edge of the array, said edge strip image having a resolution high enough that the pixel size is less than half of the minimum repeating dimension of the cells in the array, and the edge strip image being at least X cells in length and substantially smaller than the field of view in the first image;

(v) using pattern recognition to automatically count X cells to determine the location of the desired row containing the feature of interest;

(vi) obtaining a row strip image along the desired row, said row strip image having a resolution high enough that the pixel size is less than half of the minimum repeating dimension of the cells in the array, and the row strip image being at least Y cells in length and substantially smaller than the field of view in the first image, and the row strip image including at least one fiducial and the feature of interest;

(vii) using pattern recognition to automatically count Y cells along the desired row to determine the location of cell address X, Y containing the feature of interest; and (viii) determining the offset between the at least one fiducial and the location of cell address X, Y containing the feature of interest; and (ix) using the recorded offset to control the placement of a particle beam relative to the sample.

* * * * *